US006535003B2

(12) United States Patent
Aldaz et al.

(10) Patent No.: US 6,535,003 B2
(45) Date of Patent: Mar. 18, 2003

(54) CONTACT STRUCTURE HAVING SILICON FINGER CONTACTOR

(75) Inventors: Robert Edward Aldaz, Carol Stream, IL (US); Theodore A. Khoury, Evanston, IL (US)

(73) Assignee: Advantest, Corp., Tokyo (JP)

( * ) Notice: Subject to any disclaimer, the term of this patent is extended or adjusted under 35 U.S.C. 154(b) by 0 days.

(21) Appl. No.: 10/078,603

(22) Filed: Feb. 19, 2002

(65) Prior Publication Data

US 2002/0075021 A1 Jun. 20, 2002

Related U.S. Application Data

(63) Continuation-in-part of application No. 09/240,442, filed on Jan. 29, 1999, now Pat. No. 6,420,884.

(51) Int. Cl.[7] .............................................. G01R 31/02
(52) U.S. Cl. .................................................... 324/754
(58) Field of Search ................................. 324/754, 755, 324/760–762, 158.1, 73.1, 72.5; 439/169, 174, 482, 912

(56) References Cited

U.S. PATENT DOCUMENTS

| 5,621,333 A | * | 4/1997 | Long et al. .................. 324/762 |
| 5,670,889 A | * | 9/1997 | Okubo et al. ............... 324/760 |
| 6,420,884 B1 | * | 7/2002 | Khoury et al. .............. 324/754 |

* cited by examiner

Primary Examiner—Kamand Cuneo
Assistant Examiner—Minh N. Tang
(74) Attorney, Agent, or Firm—Muramatsu & Associates

(57) ABSTRACT

A contact structure for electrical connection with a contact target. The contact structure is formed of a contact substrate mounting a plurality of contactors. Each of the contactors is formed of a silicon base having inclined ends, a silicon beam formed on the silicon base having a support end and a contact end, and a conductive layer formed on a top surface of the silicon beam. The support end is slightly projected from the silicon base and the contact end is substantially projected from the silicon base. The contactor is mounted on the contact substrate such that the silicon base and the support end are connected to the surface of the contact substrate through an adhesive, thereby orienting the silicon beam in a predetermined diagonal direction.

20 Claims, 20 Drawing Sheets

Fig.3 (Prior Art)
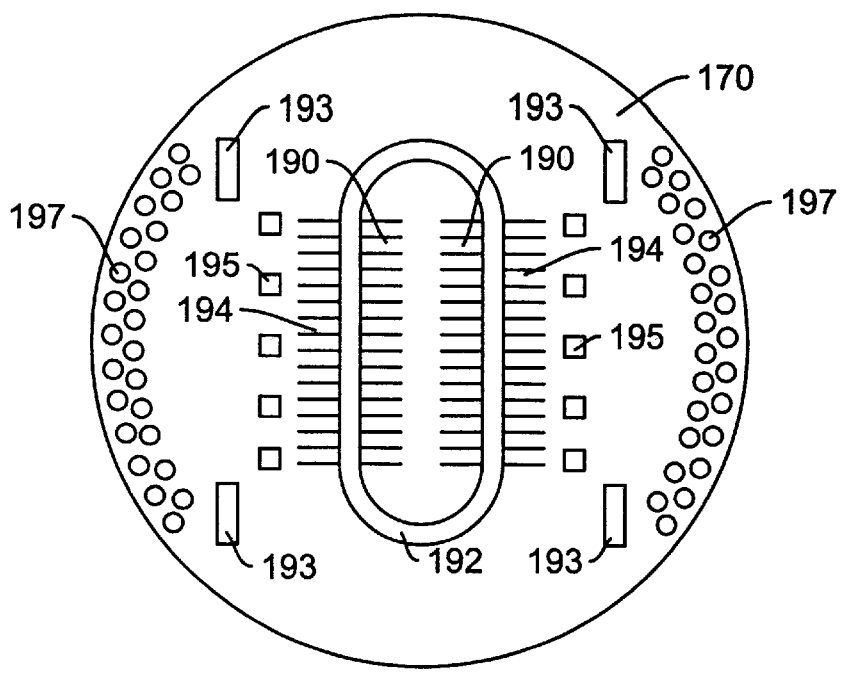
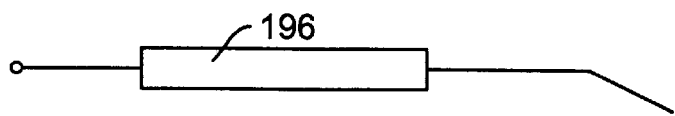
Fig. 4A
(Prior Art)
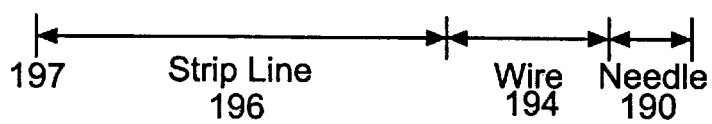
Fig. 4B
(Prior Art)
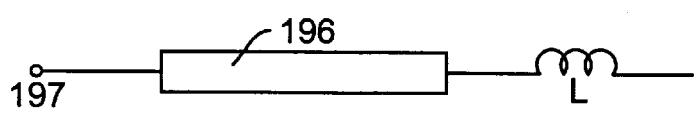
Fig. 4C
(Prior Art)
Fig. 4D
(Prior Art)
Fig. 4E
(Prior Art)

CONTACT STRUCTURE HAVING SILICON FINGER CONTACTOR

This is a continuation-in-part of U.S. patent application Ser. No. 09/240,442 filed Jan. 29, 1999 now U.S. Pat. No. 6,420,884.

FIELD OF THE INVENTION

This invention relates to contact structures to establish electrical contact with contact targets such as pads, electrode, or leads of electronic circuits or devices, and more particularly, to contact structures to be used such as in a probe card to test semiconductor wafers, packaged semiconductor devices, IC chips, printed circuit boards and the like, with an higher speed, frequency range, density and quality.

BACKGROUND OF THE INVENTION

In testing high density and high speed electrical devices such as LSI and VLSI circuits, high performance contact structures such as probe contactors must be used. The contact structure of the present invention is not limited to the application of testing, including burn-in testing, of semiconductor wafers and dice, but is inclusive of testing and burn-in of packaged semiconductor devices, printed circuit boards and the like. However, for the convenience of explanation, the present invention is described mainly with reference to the semiconductor wafer testing.

In the case where semiconductor devices to be tested are in the form of a semiconductor wafer, a semiconductor test system such as an IC tester is usually accompanied with a substrate handler, such as an automatic wafer prober, to automatically test the semiconductor wafer. Such an example is shown in FIG. 1 in which a semiconductor test system has a test head 100 which is ordinarily in a separate housing and is electrically connected to the main frame of the test system with a bundle of cables 110. The test head 100 and a substrate handler 400 are mechanically and electrically interacted with one another with the aid of a manipulator 500 driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from IC circuits on the semiconductor wafer under test are transmitted to the semiconductor test system wherein they are compared with expected data to determine whether the IC circuits on the semiconductor wafer function correctly.

As shown in FIG. 2, the test head 100 and the substrate handler 400 are connected with an interface component 140. The interface component 140 includes a performance board 120 which is a printed circuit board having electric circuit connections unique to a test head's electrical footprint, coaxial cables, pogo-pins and connectors. The test head 100 includes a large number of printed circuit boards 150 which correspond to the number of test channels or test pins. Each of the printed circuit boards has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

In the substrate handler 400, a semiconductor wafer 300 to be tested is mounted on a chuck 180. A probe card 170 is provided above the semiconductor wafer 300 to be tested. The probe card 170 has a large number of probe contactors or contact structures (such as cantilevers or needles) 190 to contact with circuit terminals or contact targets in the IC circuit of the semiconductor wafer 300 under test.

Electrical terminals or contact receptacles of the probe card 170 are electrically connected to the contact pins 141 provided on the frog ring 130. The contact pins 141 are also connected to the contact terminals 121 of the performance board 120 with coaxial cables 124 where each contact terminal 121 is connected to the printed circuit board 150 of the test head 100. Further, the printed circuit boards 150 are connected to the semiconductor test system through the cable 110 having several hundreds of inner cables.

Under this arrangement, the contactors 190 contact the surface of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the semiconductor wafer 300 performs properly.

FIG. 3 is a bottom view of the probe card 170 of FIG. 2. In this example, the probe card 170 has an epoxy ring on which a plurality of contactors 190 called needles or cantilevers are mounted. When the chuck 180 mounting the semiconductor wafer 300 moves upward in FIG. 2, the tips of the cantilever contactors 190 contact the pads or bumps on the wafer 300. The ends of the contactors 190 are connected to wires 194 which are further connected to transmission lines (not shown) formed in the probe card 170. The transmission lines are connected to a plurality of electrodes 197 which contact the pogo pins 141 of FIG. 2.

Typically, the probe card 170 is structured by a multilayer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant of the polyimide, inductances, and capacitances of the signal within the probe card 170. Thus, the signal lines are impedance matched lines to achieve a high frequency transmission bandwidth to the wafer 300 providing current during steady state and high current peaks generated by the device's outputs switching. For removing noise, capacitors 193 and 195 are provided on the probe card between the power and ground planes.

An equivalent circuit of the probe card 170 is shown in FIG. 4 to explain the limitation of bandwidth in the conventional probe card technology. As shown in FIGS. 4A and 4B, the signal transmission line on the probe card 170 extends from the electrode 197, the strip (impedance matched) line 196, the wire 194 and the contactor (needle) 190. Since the wire 194 and the contactor 190 are not impedance matched, these portions function as an inductor L in the high frequency band as shown in FIG. 4C. Because of the overall length of the wire 194 and contactor 190 is around 20–30 mm, the significant frequency limitation is resulted in testing a high frequency performance of a device under test.

Other factors which limit the frequency bandwidth in the probe card 170 reside in the power and ground needles shown in FIGS. 4D and 4E. If the power line can provide large enough currents to the device under test, it will not seriously limit the operational bandwidth in testing the device. However, because the series connected wire 194 and contactor 190 for supplying the power (FIG. 4D) as well as the series connected wire 194 and contactor 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines.

Accordingly, the most widely used probe contactors as noted above are limited to the frequency bandwidth of approximately 200 MHz which is insufficient to test recent semiconductor devices. It is considered, in the industry, that the frequency bandwidth be of at least that equal to the tester's capability which is currently on the order of 1 GHz or higher, will be necessary in the near future. Further, it is desired in the industry that a probe card is capable of handling a large number of semiconductor devices, especially memories, such as 32 or more, in parallel (parallel test) to increase test throughput.

In the conventional technology, the probe card and probe contactors such as shown in FIG. 3 are manually made, resulting in inconsistent quality. Such inconsistent quality includes fluctuations of size, frequency bandwidth, contact force and resistance, etc. In the conventional probe contactors, another factor that makes the contact performance unreliable is that the probe contactors and the semiconductor wafer under test have different temperature expansion ratios. Thus, under the varying temperature, the contact positions therebetween vary which adversely affects the contact force, contact resistance and bandwidth.

SUMMARY OF THE INVENTION

Therefore, it is an object of the present invention to provide a contact structure having a high operating frequency for electrically contacting with contact targets such as a semiconductor wafer, packaged LSI and the like.

It is another object of the present invention to provide a contact structure for establishing electrical communication with contact target such as a semiconductor wafer, packaged LSI and the like, which is suitable for testing a large number of semiconductor devices in a parallel fashion at the same time.

It is a further object of the present invention to provide a contact structure for testing a semiconductor wafer, packaged LSI and the like which is produced through a semiconductor production process without involving manual assembly or handling, thereby achieving uniform and consistent quality.

It is a further object of the present invention to provide a contact structure to be used in combination with a probe card for testing a semiconductor wafer, packaged LSI and the like, which are capable of compensating temperature expansion coefficient of a semiconductor wafer under test.

In one aspect of the present invention, the contact structure is formed of a plurality of beam like contactors and a contact substrate mounting the contactors. Typically, the contactors are formed through a photolithography technology. The contactor is configured by a silicon base having an inclined edge at each end, a silicon beam provided on the silicon base and projected from the silicon base and has an diagonal edge at each end, and a conductive layer formed along a top surface of the silicon beam.

Another aspect of the present invention is a contact structure if formed of a plurality of finger like contactors each having a bonding step thereon and a contact substrate mounting the contactors. Typically, the contactors are produced through the photolithography process. The contactor is configured by a silicon base having an inclined edge at each end, a silicon beam provided on the silicon base and projected from the silicon base and has an diagonal edge at each end, a conductive layer formed along a top surface of the silicon beam, and a bonding step formed on the surface of the conductive layer.

A further aspect of the present invention is a process for producing the contact structure. The method of producing the contact structure is comprised of the steps of providing a silicon substrate cut in a (100) crystal plane, forming a mask pattern on an upper surface of the silicon substrate, applying an etching process to the upper surface of the silicon substrate for forming a silicon beam, forming a mask pattern on a bottom surface of the silicon substrate, applying an etching process to the bottom surface of the silicon substrate for forming a silicon base, and depositing conductive material on a top surface of the silicon beam.

According to the present invention, the contact structure has a very high frequency bandwidth to meet the requirements in the next generation semiconductor technology. Since the contactors are produced through a semiconductor production process, a large number of contactors can be aligned in a small space which is suitable for testing a large number of semiconductor devices at the same time.

Since the large number of contactors are produced at the same time on the substrate with the use of the semiconductor microfabrication technology without involving manual handling, it is possible to achieve consistent quality, high reliability and long life in the contact performance. Further, because the probe contactors can be fabricated on the same substrate material as that of the device under test, it is possible to compensate the temperature expansion coefficient of the device under test, which is able to avoid positional errors.

BRIEF DESCRIPTION OF THE DRAWINGS

FIG. 3 is a bottom view showing an example of the probe card having an epoxy ring for mounting a plurality of cantilevers as probe contactors.

FIGS. 4A–4E are circuit diagrams showing equivalent circuits of the probe card of FIG. 3.

DETAILED DESCRIPTION OF THE INVENTION

Figure 1:
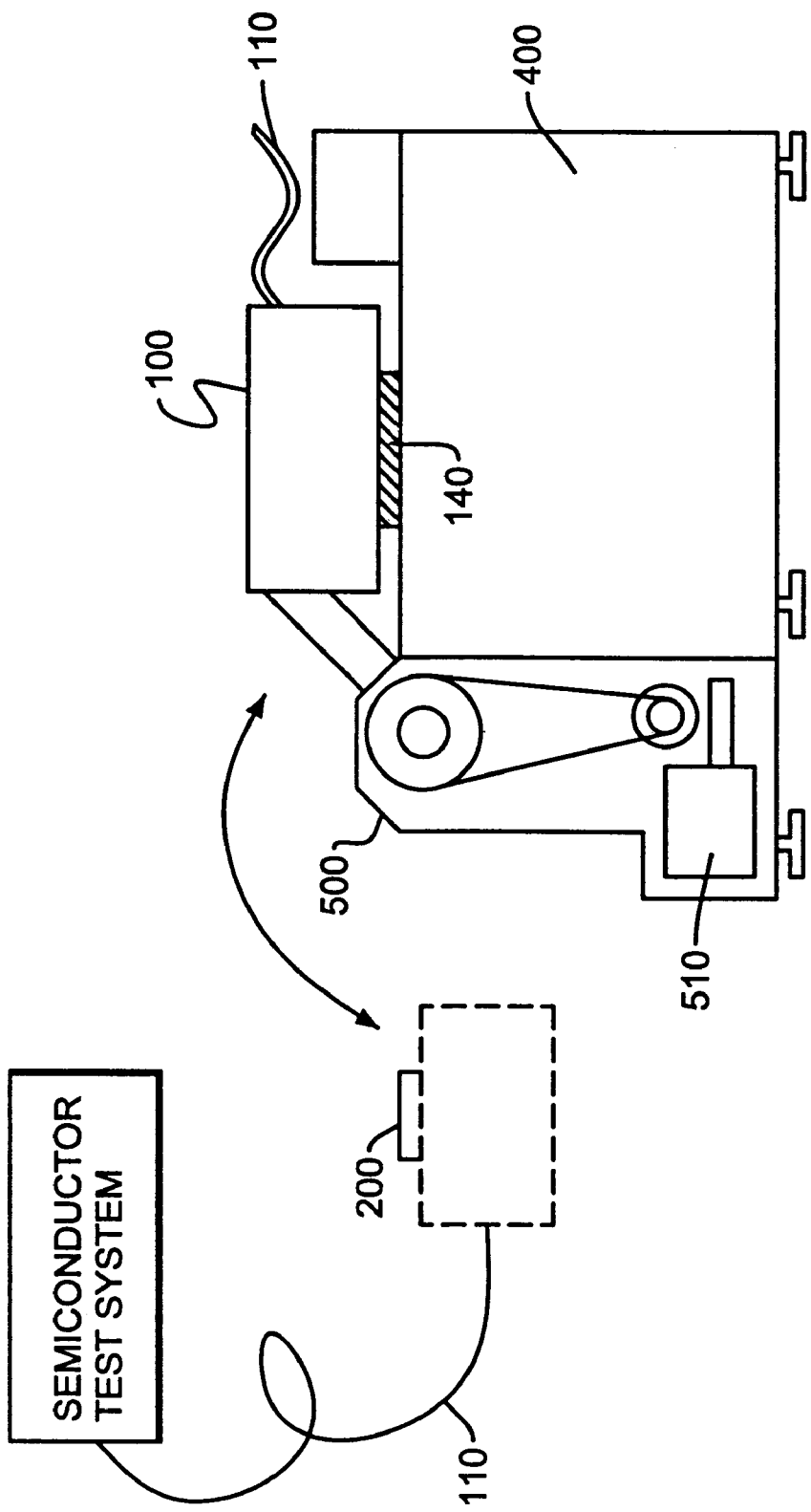
FIG. 1 is a schematic diagram showing a structural relationship between a substrate handler and a semiconductor test system having a test head.
Figure 2:
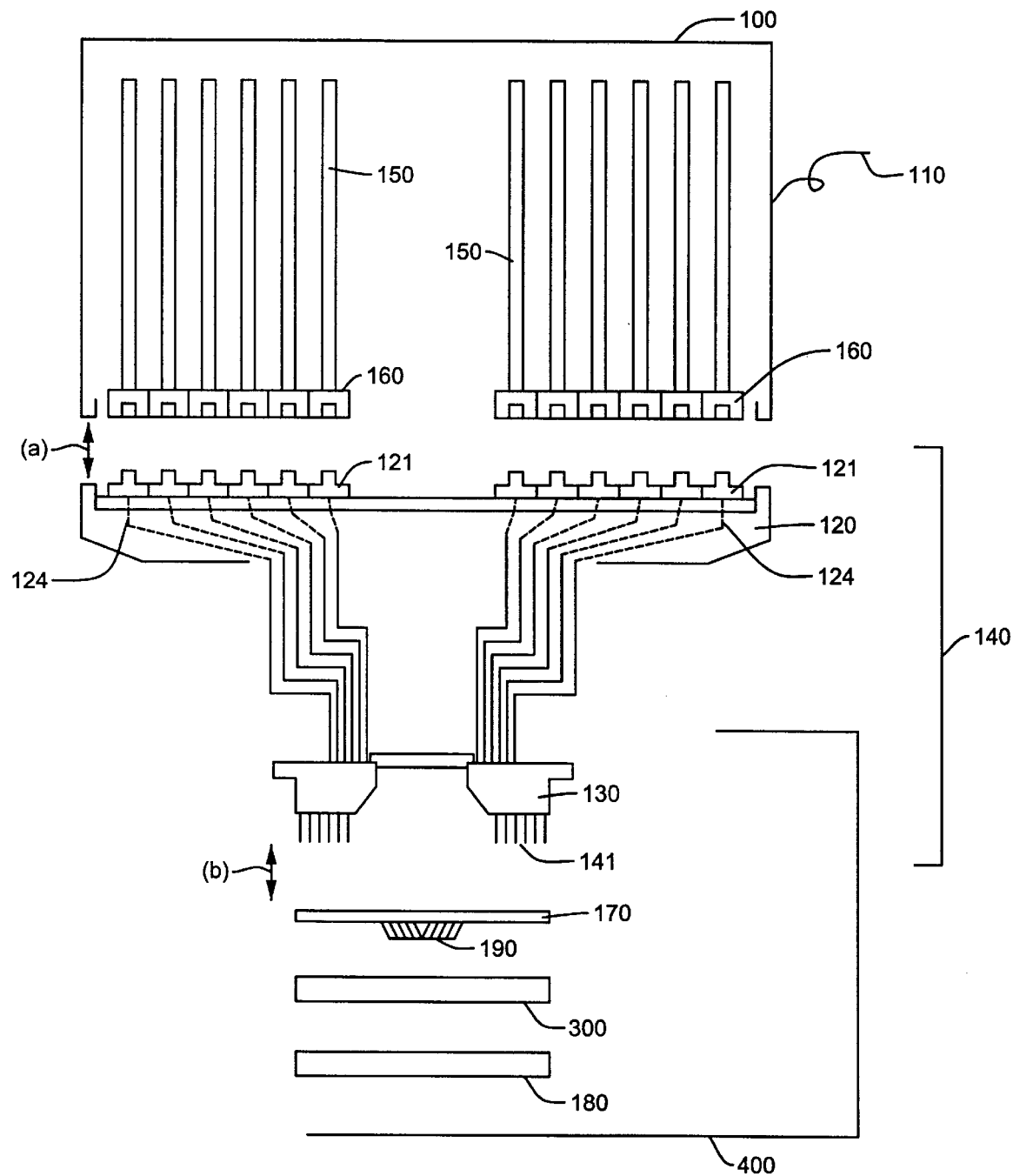
FIG. 2 is a schematic diagram showing an example of detailed structure for connecting the test head of the semiconductor test system to the substrate handler.
Figure 5:
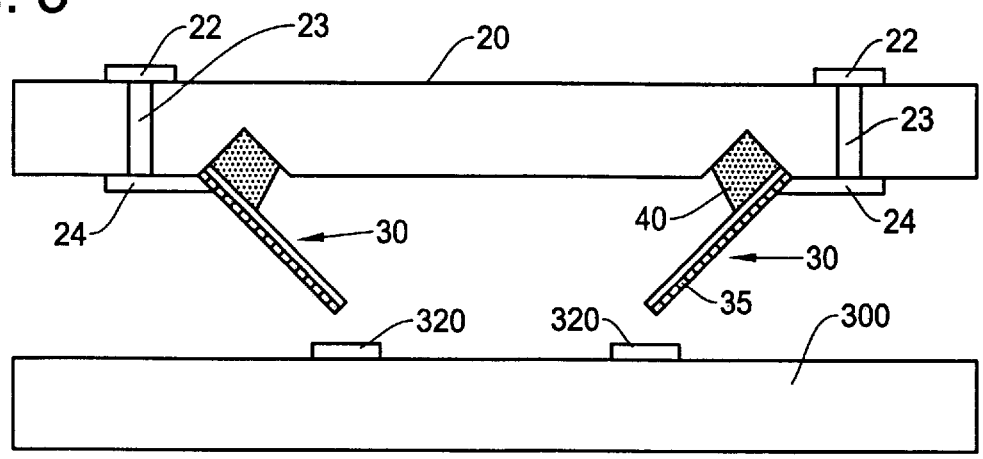
FIG. 5 is a cross sectional view showing a contact structure of the present invention formed with contactors mounted on a contact substrate.

The contact structures of the present invention will be described with reference to FIGS. 5–20. FIG. 5 shows an example of contactor structure of the present invention formed of contactors 30 and a contact substrate 20 mounting the contactors 30. The contactors 30 are produced through a photolithography process. The contact structure is so positioned over contact targets such as contact pads 320 on the semiconductor wafer 300 to be tested that the contactors 30 establish electric contact with the semiconductor wafer 300 when pressed with each other. Although only two contactors 30 are shown in FIG. 5, a large number of contactors 30 are aligned on the contact substrate 20 in an actual semiconductor wafer test.

Such a large number of contactors are produced through the same photolithography process on a silicon substrate as will be explained later. When the semiconductor wafer 300 under test moves upward, the contactors 30 contact with the corresponding contact targets (contact pads, electrodes) 320 on the semiconductor wafer 300. The pitch between the contact pads 320 may be as small as 50 µm or less where the contactors 30 can easily be aligned in the same pitch since they are made through the same semiconductor production process as that of the semiconductor wafer 300.

The contactors 30 on the substrate 20 can be mounted on a probe card directly such as shown in FIG. 3 or through a space transformer. Alternatively, the contactors are molded in a package, such as a traditional IC package having leads, so that the package is mounted on a probe card, or interconnected with other substrate. Since the contactors 30 can be fabricated in a very small size, an operable frequency range of a probe card mounting the contact structures of the present invention can be easily increased to 2 GHz or higher. Because of the small size, the number of contactors on a probe card can be increased to, for example 2,000 or more, which is able to test as many as 32 or more semiconductor devices in parallel at the same time.

Furthermore, because the contactors 30 of the present invention are formed on the contact substrate 20, which is typically a silicon substrate, environmental changes such as a temperature expansion ratio of the silicon substrate are the same as those of the semiconductor wafer 300 under test. Therefore, the accurate positioning between the contactors 30 and the contact targets 320 can be maintained throughout the test or other applications.

In FIG. 5, the contactor 30 has a conductive layer 35 in a finger (beam) like shape. The contact structures also has a base 40 which is attached to the contact substrate 20. An interconnect trace 24 is connected to the conductive layer 35 at a bottom surface of the contact substrate 20. Such a connection between the interconnect trace 24 and the conductive layer 35 is made, for example, through a solder ball (not shown). The substrate 20 further includes a via hole 23 and an electrode 22. The electrode 22 is to interconnect the contact substrate 20 to an external structure such as a probe card or IC package through a wire or lead.

Thus, when the semiconductor wafer 300 moves upward, the contactors 30 on the contact substrate 20 and the contact targets 320 on the semiconductor wafer 300 mechanically and electrically contact with each other. Consequently, signal paths will be established from the contact targets 320 to the electrodes 22 on the contact substrate 20. The interconnect trace 24, the via hole 23 and the electrode 22 also function to fan-out the small pitch of the contactors 30 to a larger pitch to fit to the probe card or IC package.

Because of the spring force of the beam like shape of the contactor 30 mounted in a diagonal direction on the contact substrate 20, the end of the conductive layer 35 produces a resilient contact force when the semiconductor wafer 300 is pressed against the contact structure. The end of the conductive layer 35 is preferably sharpened to achieve a scrubbing effect when pressed against the contact pad 320 by penetrating through a metal-oxide layer on the surface of the pad 320.

For example, if the contact pad 320 on the semiconductor wafer 300 has an aluminum oxide layer on its surface, the scrubbing effect is necessary to establish the electric contact with low contact resistance by breaking the aluminum oxide layer. The resilient spring force derived from the beam like shape of the contactor 30 achieves a reliable contact performance with the contact target 320. The elasticity produced by the spring force of the contact structure also functions. to compensate the differences in size or the fluctuation of flatness involved in the substrate 20, the contact target 320 and the wafer 300, as well as the contactors 30.

An example of material of the conductive layer 35 includes nickel, aluminum, copper, nickel palladium, rhodium, nickel gold, iridium or several other depositable materials. An example of size of the contactor 30 intended for a test probe application is 100–500 μm in overall height, 100–600 μm in horizontal length, and about 30–50 μm in width for the pitch of 50 cm or more between contact targets 320.

Figure 6:
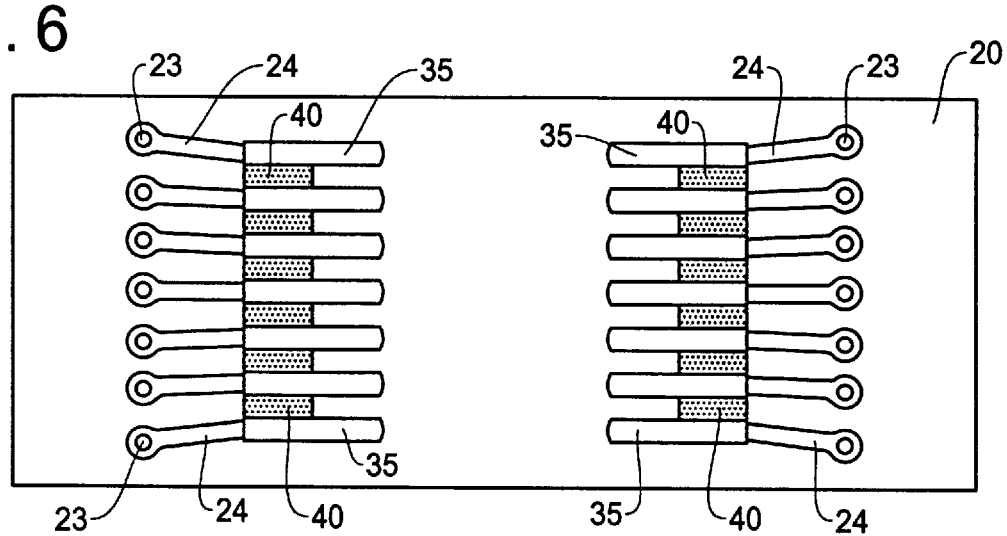
FIG. 6 is a schematic diagram showing a bottom view of the contact substrate of FIG. 5 having the contactors of the present invention.

FIG. 6 is a bottom view of the contact structure of FIG. 5 having a plurality of contactors 30 on the contact substrate 20. In an actual system, a larger number of contactors 30, such as several hundreds of them, will be aligned in the manner similar to that shown in FIG. 6. Each set of the interconnect trace 24, the via hole 23 and the electrode 22 establishes a signal path from the tip of the conductive layer 35 as well as functions to fan-out the small pitch of the contactors 30 to a larger pitch to fit to the probe card or IC package.

Figure 7:
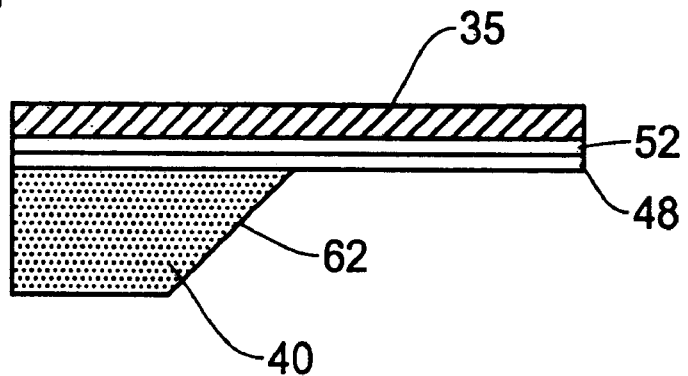
FIG. 7 is a schematic diagram showing a more detailed cross sectional view of one of the contactor of the present invention.
Figure 8:
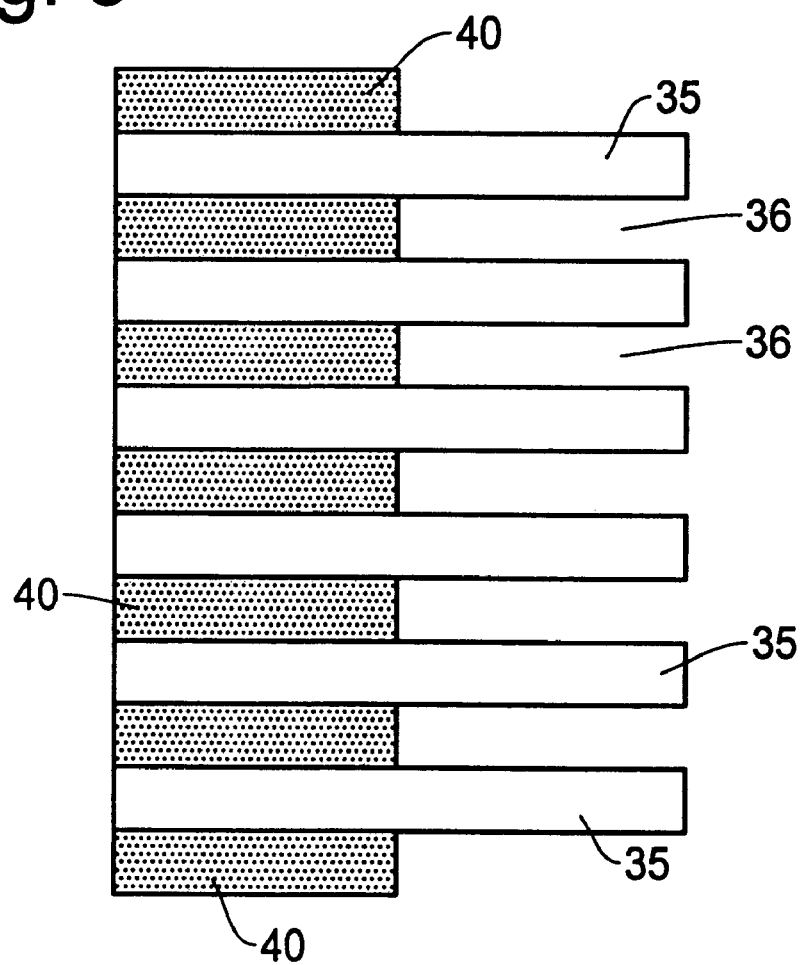
FIG. 8 is a schematic diagram showing a top view of the contactors of FIG. 7.

FIGS. 7 and 8 show a more detailed view of the contactor 30 of the present invention. In the cross sectional front view of FIG. 7, the contactor 30 includes a silicon base 40, a boron doped layer 48, a insulation layer 52, and a conductive layer 35. The silicon base 40 has an angled support 62 to support the finger like portion of the contactor 30. As will be explained later, the angled support 62 is produced through an anisotropic etching process in a specific crystalline. The boron doped layer 48 is to function as an etch stopper during the production process. The boron dope layer 48 is not essential but is convenient to control the etching progress during the production process of the contactors 30. The insulation layer 52 is typically a silicon dioxide layer to electrically insulate the conductive layer 35 from the other parts of the contactor 30.

FIG. 8 is a top view of the contact structure of FIG. 7, wherein a plurality of conductive layers 35 are shown in a finger like shape. Between the two adjacent conductive layers 35, there is a free space 36 so that each finger (beam) portion of the contact structure is independent from the other and is moveable separately from the other. Such free spaces 36 are created through the etching process noted above by etching away the predetermined portions of the silicon substrate without the boron doped layer as will be further explained later.

FIGS. 9A–9J show an example of process for producing the contactors 30 of the present invention through the photolithography technology. In this example, a large number of pairs of contactors are formed on a silicon substrate, and each pair of the contactors are separated from each other in a later stage.

Figure 9A:
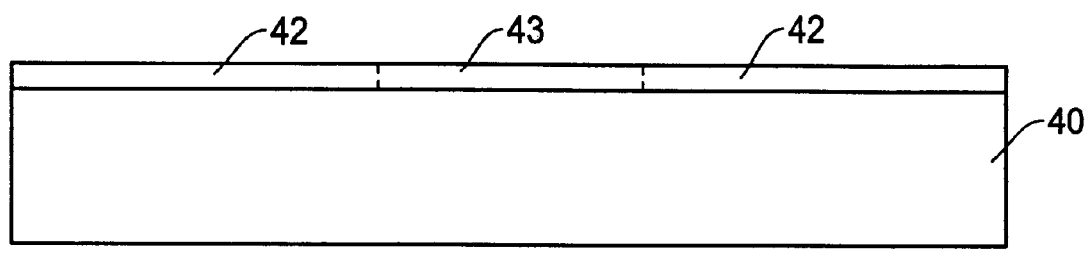
FIGS. 9A and 9C–9J are schematic cross sectional views showing a process for producing the contactors of the present invention.
Figure 9B:
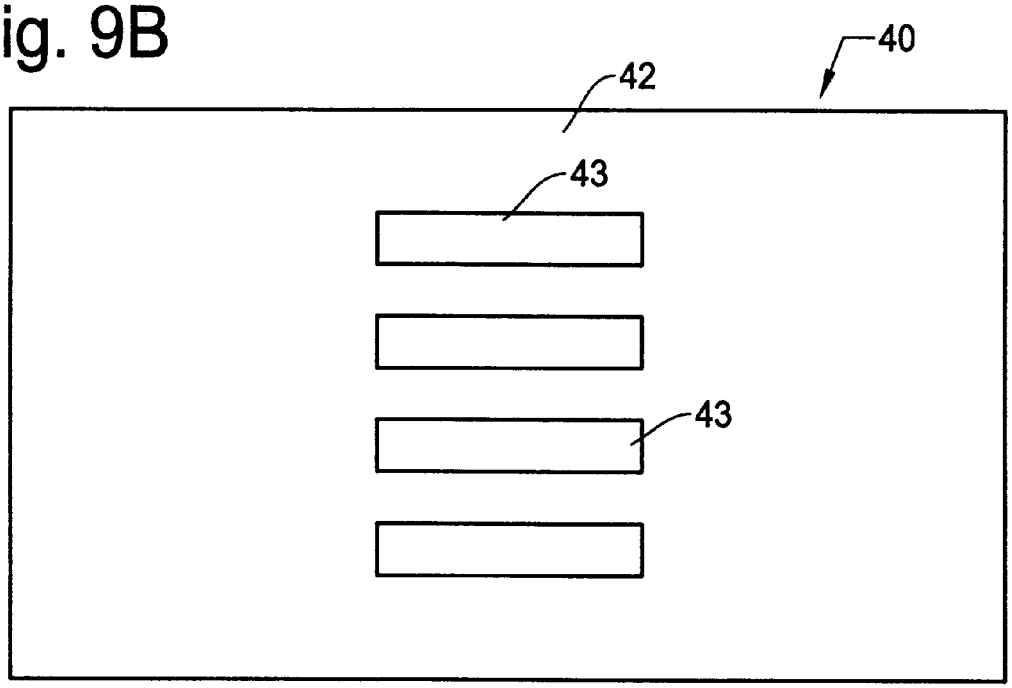
FIG. 9B is a top view of the substrate corresponding to the cross sectional view of FIG. 9A.

In FIG. 9A, a photo resist layer 42 is provided on a silicon substrate 40. The photo resist layer 42 is to create a boron doped layer on the silicon substrate 40. Although not shown, a photo mask is aligned over the silicon substrate 40 so that the photo resist layer 42 be exposed with photo energy such as ultraviolet light. Thus, a pattern such as shown in FIG. 9B which is a top view of the substrate of FIG. 9A is created in which specified portions 43 show cured photo resist resulted from the exposure to the ultraviolet light. The unexposed part of the photo resist 42 can be dissolved and washed away, leaving the specified portions 43 on the silicon substrate 40.

Figure 9C:
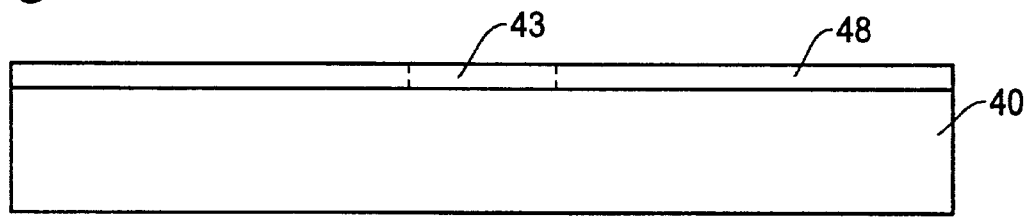

An etch stop agent, such as boron is doped in the upper surface of the silicon substrate having the cured photo resist at the specified portions 43. Because of the photo resist, the specified portions 43 of the silicon substrate 40 are not doped with the boron. Thus, after removing the photo resist in the portions 43, a boron doped layer 48 is created as shown in FIG. 9C in which the boron is doped in a thin layer over the silicon substrate except in the specified areas 43. The silicon substrate in the specified areas 43 without the boron will be etched away in an anisotropic etching process as will be described later.

Figure 9D:
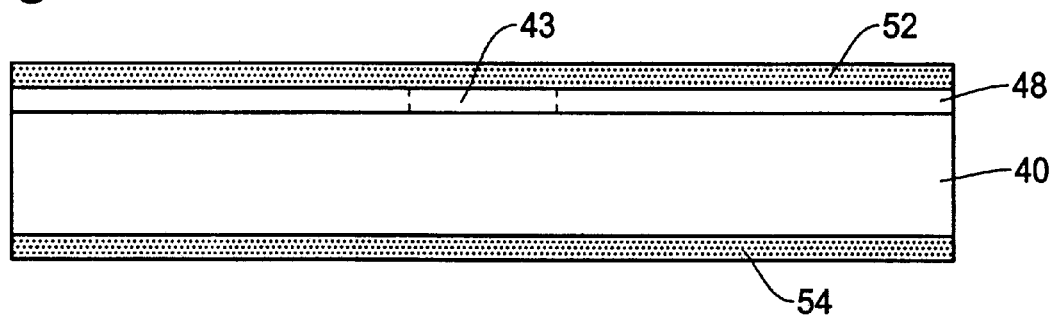
Figure 9E:
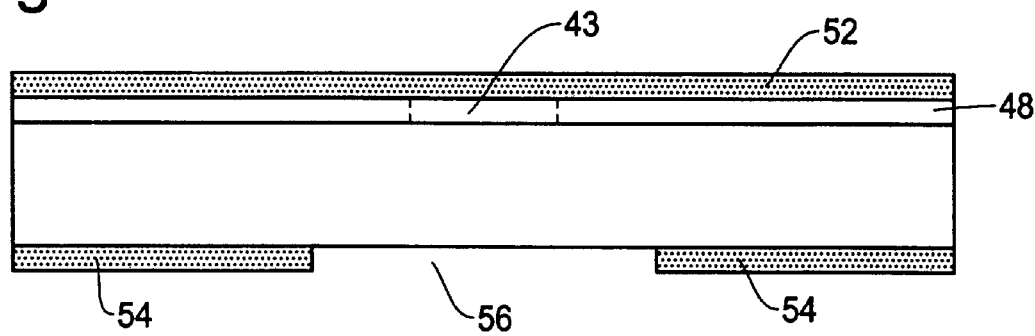

In FIG. 9D, silicon dioxide ($SiO_2$) layers 52 and 54 are produced on the upper surface and bottom surface of the silicon substrate 40. The silicon dioxide layer 52 is to function as an insulator when a conductive layer 35 (such as shown in FIG. 7) is created. Other dielectric material can also be feasible for this layer. The silicon dioxide layer 54 at the bottom surface of the silicon substrate 40 is to function as an etching mask as in FIG. 9E. The silicon dioxide layer 54 is removed through a photolithography process to define an etching area 56. In this example, the etching area 56 is formed at about the center of the bottom surface of the silicon substrate 40.

Figure 9F:
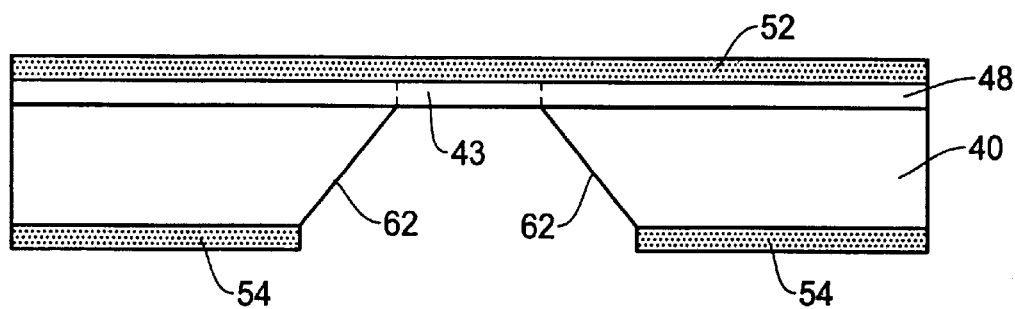

In FIG. 9F, an anisotropic etching process is performed for the silicon substrate 40. As is known in the art, in the case where the silicon substrate 40 is cut in a (100) crystal plane, a V-shaped groove is formed through the anisotropic etching when etchant is provided at the etching area 56. The angle of the groove is 54.7° relative to the bottom surface of the silicon substrate 40. The groove angle is the same as a (111) crystal plane of the silicon substrate 40. Examples of etchant for this purpose include EDP (ethylene diamine pyrocatechol), TMAH (tetra methyl ammonium hydroxide) and KOH (potassium hydroxide).

As a result of the anisotropic etching process, as shown in FIG. 9F, the angled support 62 is created whose size is dependent upon the size of the etching area (etch window) 56 and a time length of the etching process. Because of the boron doped layer 48, the etch is stopped at the boron layer 48 while the specified areas 43 without boron are etched away, resulting in the spaces 36 of FIG. 8 when the beam portions are cut into half as will be described later. Because of the spaces 36, each of the contact structures 30 are physically separated from one another. As is known in the art, such etch stop can also be done without using the etch stopper, but rather controlling the etching time.

Figure 9G:
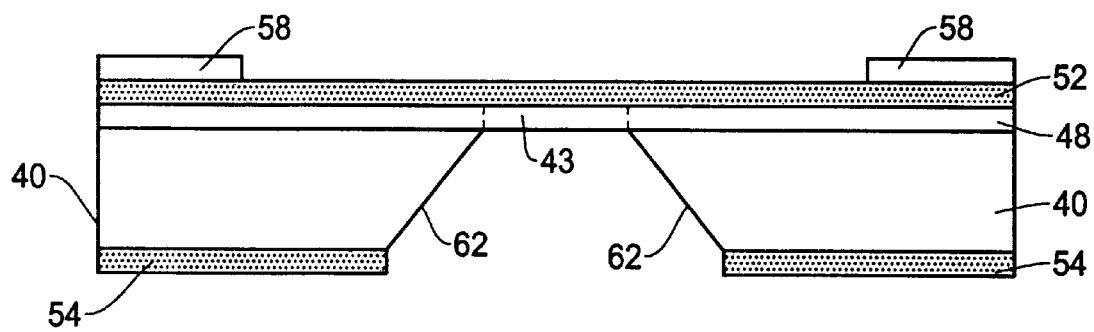
Figure 9H:
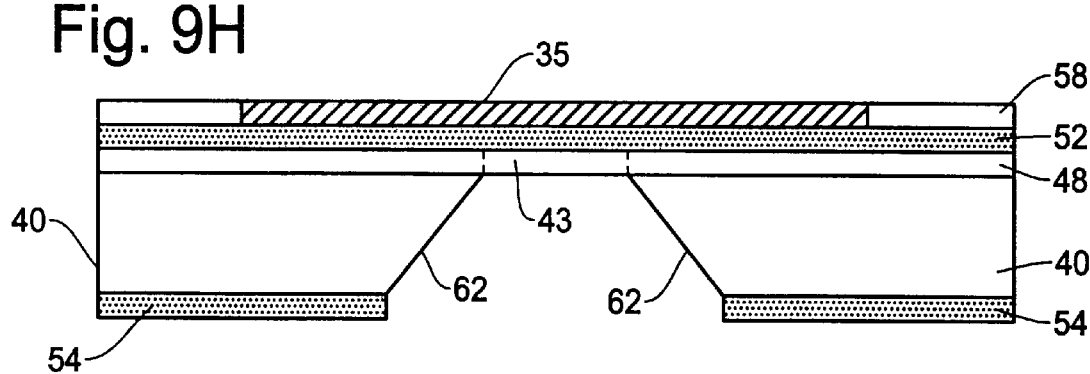
Figure 9I:
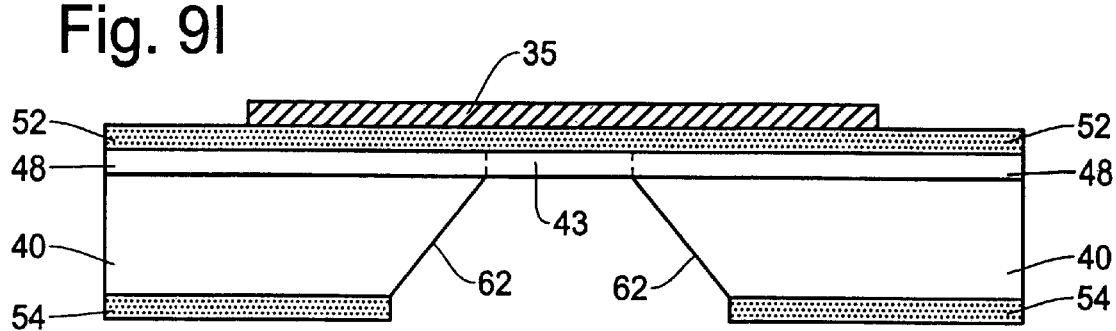

In FIG. 9G, a plating seed layer (not shown) is formed on the silicon dioxide layer 52. A further photolithography process is performed on the silicon substrate 40 to create a photo resist pattern for forming conductive layer 35. The cured photo resist 58 resulted from this photolithography process is shown in FIG. 9G. A plating process is carried out to produce the conductive layer 35 as shown in FIG. 9H. As is well known in the art, other deposition processes can also be used for creating the conductive layer 35.

Figure 9J:
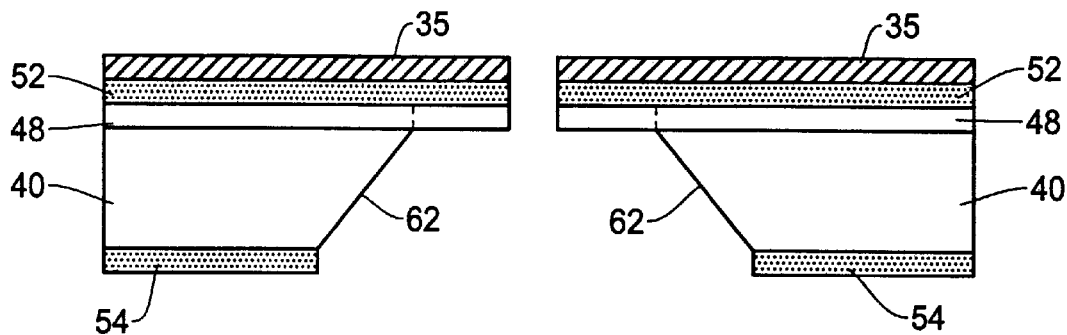

An example of material in the conductive layer 35 includes nickel, aluminum and copper. Alternatively, a variety of deposition techniques can be used in producing the conductive layer 35 including vacuum evaporation, cathode sputtering, vapor-phase deposition. The photo resist 58 is removed in FIG. 9I. Finally, the silicon substrate 40 is cut into half at the center thereof (beam portions) as shown in FIG. 9J. Unwanted portions at both ends of the silicon substrate 40 may also be cut out.

Figure 10A:
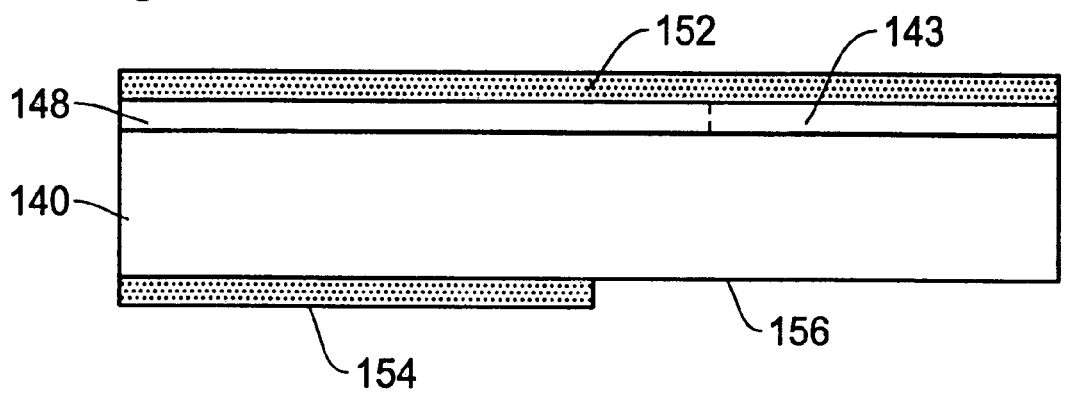
FIGS. 10A–10C are schematic cross sectional views showing another process for producing the contactors of the present invention.
Figure 10B:
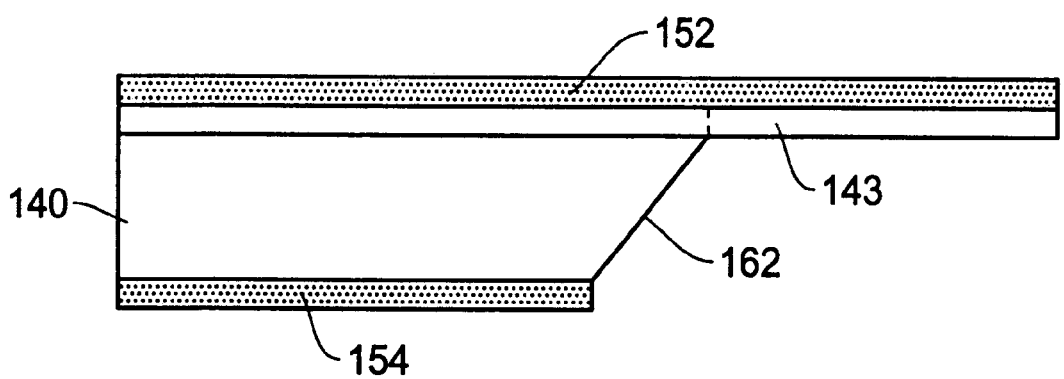
Figure 10C:
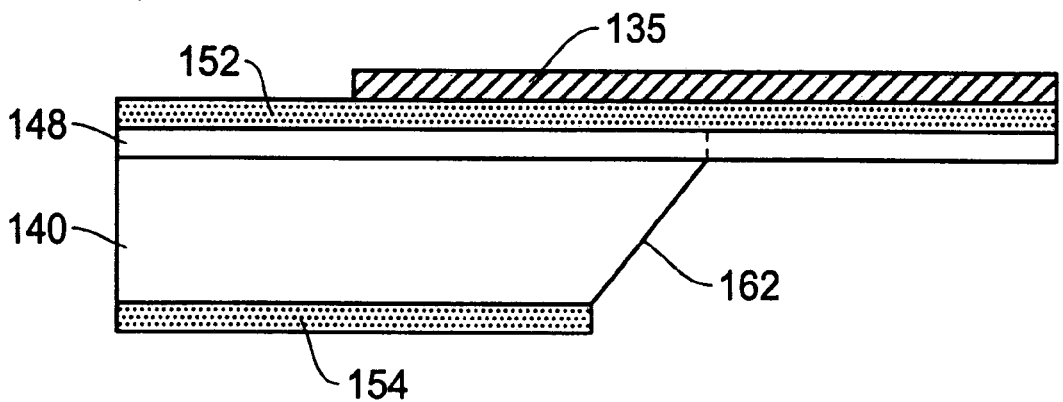

FIGS. 110A–10C show another example of process for producing the contactors 30 of the present invention through the photolithography technology. Unlike the example of FIGS. 9A–9J in which a large number of pairs of contact structures are integrally created and separated from one another at the last stage, a large number of separate contact structures are formed at the edge of the silicon substrate.

In FIG. 10A, a boron doped layer 148 is formed on the silicon substrate 140 wherein specified (etch-out) areas 143 are defined as areas which are not doped with boron. A dielectric layer 152 such as silicon dioxide $SiO_2$ is provided on the boron doped layer 148 to establish as an insulator. A silicon dioxide $SiO_2$ layer 154 is also provided at the bottom surface of the silicon substrate 140 as an etch mask. An etch window 156 is defined by a photolithography process (not shown) for allowing an anisotropic etch therethrough as noted above.

The anisotropic etch process is performed on the silicon substrate 140 which creates an angled portion along with the (111) crystal plane of the silicon substrate 140 as in FIG. 10B. As noted above, this angle is 54.7° with respect to the bottom surface of the silicon substrate 140. Because the specified portions 143 are not doped with boron, the silicon substrate in these areas are etched away, leaving the finger (comb) like structure in a plan view at the right end of FIG. 10B. As noted above with reference to FIG. 9F, such etch stop control can also be done without using the etch stopper, but rather controlling the etching time.

In FIG. 10C, a further photolithography process is performed to form a photo resist layer (not shown) and a conductive layer 135 is created through a plating process. The resultant contactors 30 are cut into an appropriate shape such as shown in FIG. 7.

Figure 11A:
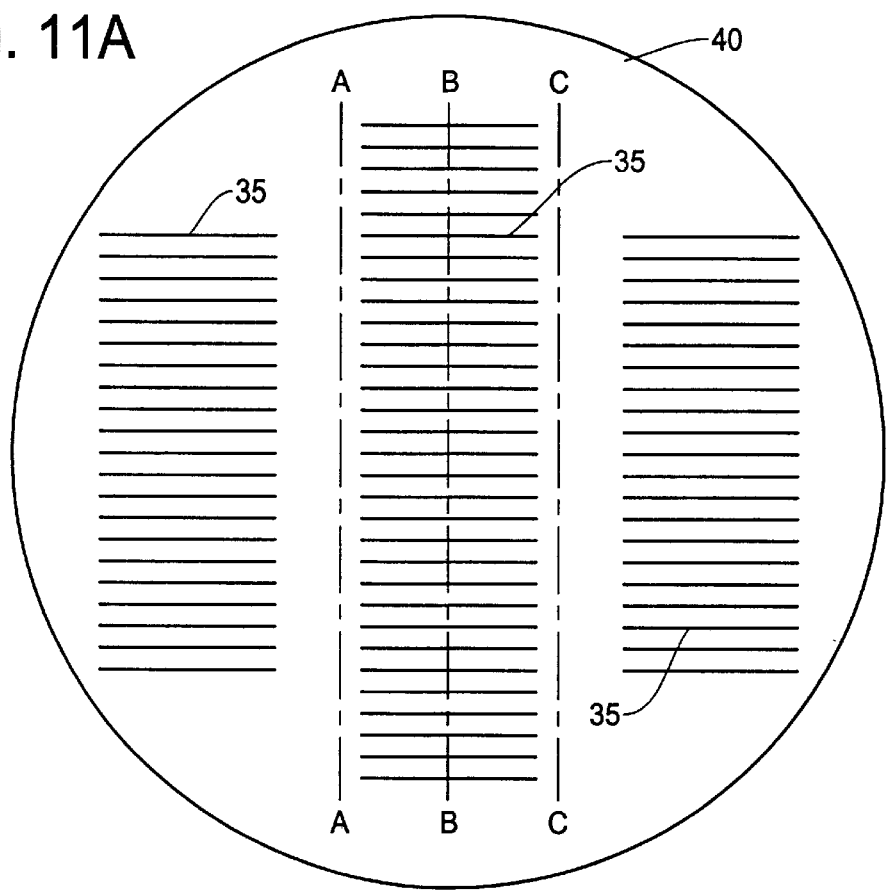
FIGS. 11A–11C are top views of a silicon wafer and cut-out thereof for producing a large number of contactors of the resent invention at the same time.
Figure 11B:
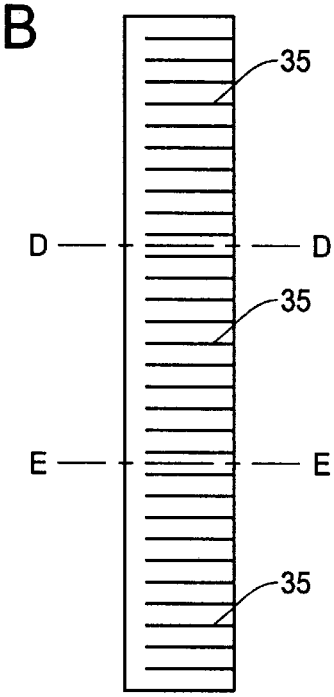
Figure 11C:
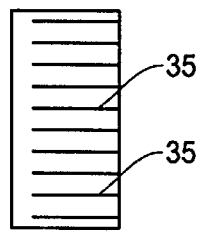

FIGS. 11A–11C are schematic diagrams showing an example of process for producing a large number of contactors on a silicon substrate (silicon wafer) 40. The photolithography process shown in FIGS. 9A–9J creates a large number of contactors shown by conductive beams 35 on the silicon substrate 40 in FIG. 11A. The silicon substrate 40 is cut out in a dicing or etching process at lines A—A, B—B and C—C, for example. The resultant contactors shown in FIG. 11B may further be cut into smaller units, if necessary, at D—D and E—E lines if the number of conductive beams 35 need to be small in an intended application as shown in FIG. 11C.

Figure 12A:
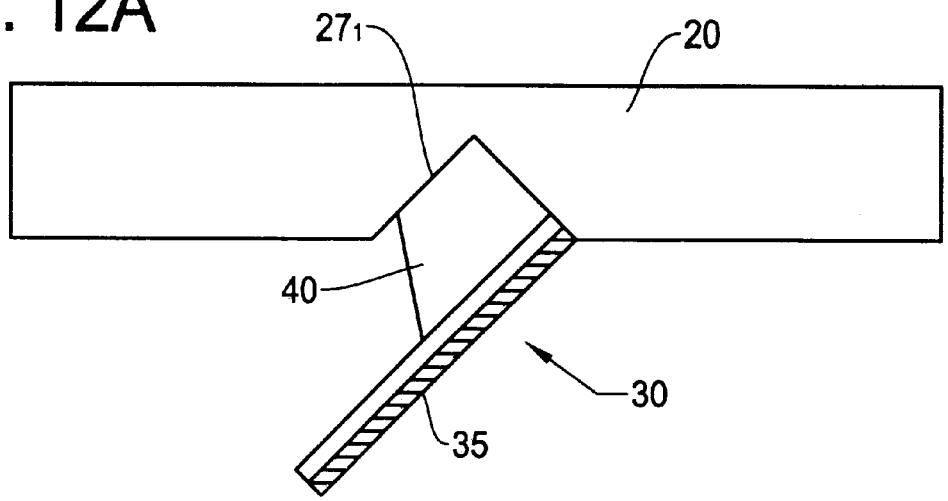
FIGS. 12A and 12B are schematic cross sectional views showing examples of method for assembling the contactors of the present invention on the contact substrate.
Figure 12B:
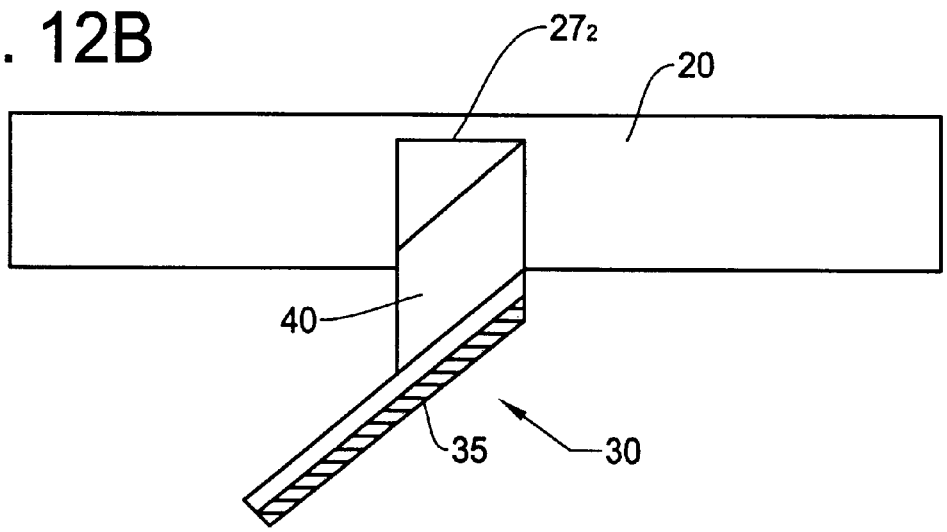

FIGS. 12A and 12B are schematic cross sectional views showing examples of method for assembling the contact structure of the present invention by mounting the contactors 30 on the contact substrate 20. An example of material of the contact substrate 20 includes silicon and ceramic. In case where the substrate is made of silicon, grooves $27_1$ or $27_2$ for mounting the contactors 30 may be formed through an anisotropic etching or other etching processes on the surface of the contact substrate 20.

When the contact substrate is made of silicon, it has an advantage in that the temperature expansion of the contact substrate can compensate the temperature expansion of the semiconductor wafer under test. A ceramic substrate has a mechanical strength and physical stability superior to the silicon substrate. The silicon base 40 of the contact structure is inserted in the grooves $27_1$ or $27_2$ provided on the contact substrate 20 and fixed therein with use of, for example, an adhesive or epoxy resin.

FIGS. 13A–13D are schematic cross sectional views showing a further example of process for producing the contactors of the present invention. In this example, a contactor shown in FIG. 13D has two inclined portions $262_1$ and $262_2$ on the base thereof. The inclined portion $262_2$ can be used to determine the angle of the beam relative to the contact substrate when mounting the contactor on the planar surface of the contact substrate as shown in FIG. 14 as will be explained later.

Figure 13A:
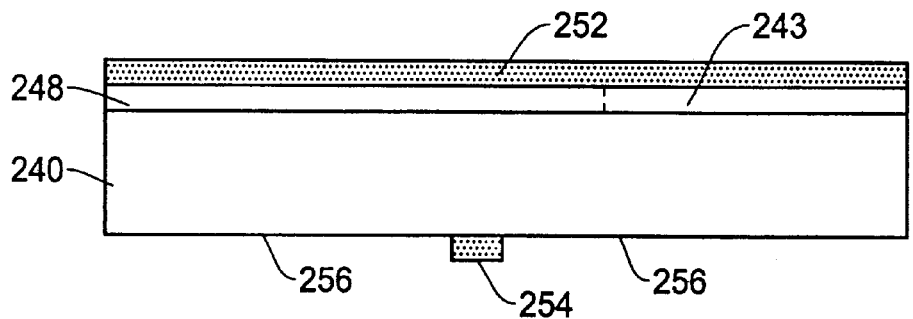
FIGS. 13A–13D are schematic cross sectional views showing a further example of process for producing the contactors of the present invention.
Figure 14:
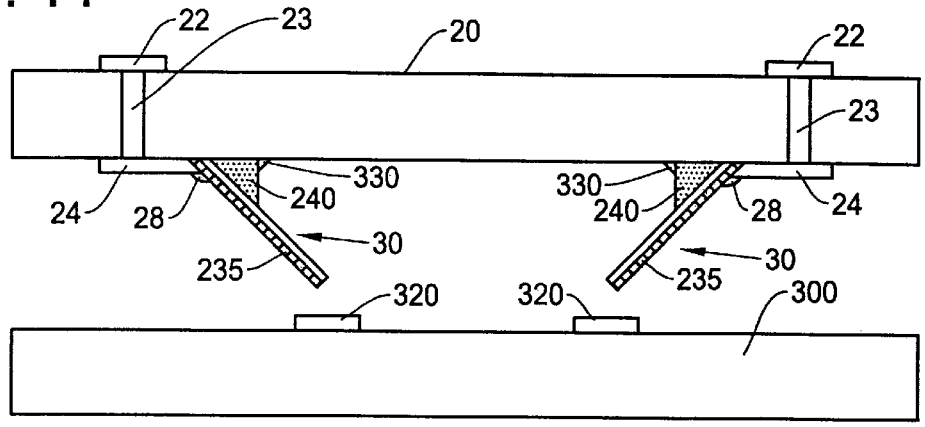
FIG. 14 is a cross sectional view showing another example of contact structure formed with contactors and a contact substrate mounting the contactors produced through the process of FIGS. 13A–13D, and a semiconductor wafer with contact targets.

In FIG. 13A, a boron doped layer 248 is formed on the silicon substrate 240 wherein specific (etch-out) areas 243 are defined as areas that are not doped with boron. A dielectric layer 252 such as silicon dioxide $SiO_2$ is provided on the boron doped layer 248 to establish an insulation layer. A silicon dioxide $SiO_2$ layer 254 is also provided at the bottom surface of the silicon substrate 140 as an etch mask. An etch windows 256 are defined by a photolithography process (not shown) for allowing an anisotropic etch therethrough as noted above.

Figure 13B:
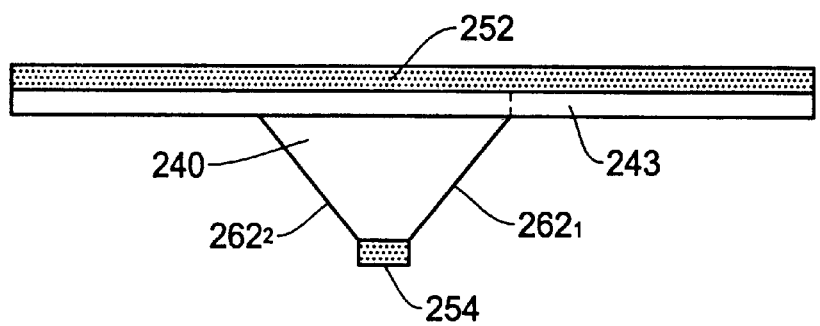

The anisotropic etch process is performed on the silicon substrate 240 which creates angled portions $262_1$ and $262_2$ along with the (111) crystal plane of the silicon substrate 240 as in FIG. 13B. As noted above, this angle is 54.7° with respect to the bottom surface of silicon substrate 240. Alternatively, the inclined portion $262_2$ can be made by dicing the silicon substrate 240 rather than the etching process noted above. Because the specified portions 243 are not doped with boron, the silicon substrate in these areas are etched away, leaving the finger (comb) like structure in a plan view at the right end of FIG. 13B.

Figure 13C:
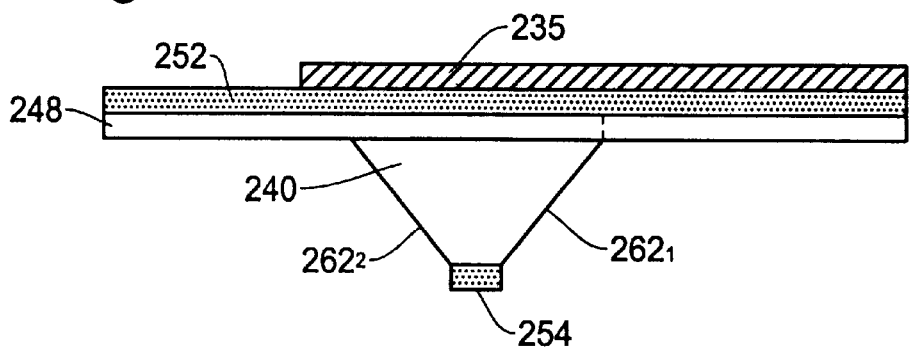
Figure 13D:
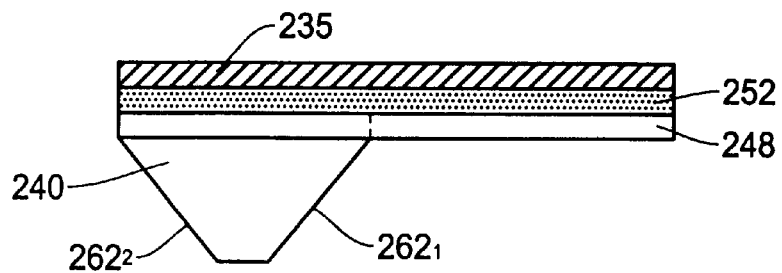

In FIG. 13C, a further photolithography process is performed to form a photo resist layer (not shown) so that a conductive layer 235 is created through a deposition process such as plating. The resultant contactors 30 are cut into an appropriate shape such as shown in FIG. 13D.

FIG. 14 is a cross sectional view showing a contact structure of the present invention formed with contactors 30 and a contact substrate 20 mounting the contactors 30 thereon. The contactors 30 are produced through the photolithography process of FIGS. 13A–13D. The contact structure is positioned over a semiconductor wafer 300 having contact targets 320. Unlike the examples of FIGS. 5 and 12, the contactors 30 in this example are mounted on a flat surface of the contact substrate 20. Namely, the inclined portion $262_2$ 'on the silicon substrate (base) 240 shown in FIG. 13D is placed on the planar surface of the contact substrate 20. The contactors 30 are fixed to the planar surface at the bottom of the contact substrate 20 with adhesives 330 such as high temperature adhesives.

In the example of FIG. 14, similar to FIG. 5, an interconnect trace 24 is connected to the conductive layer 235 at the bottom surface of the contact substrate 20. Such a connection between the interconnect trace 24 and the conductive layer 235 is made, for example, through a solder ball 28. The contact substrate 20 further includes a via hole 23 and an electrode 22. The electrode 22 is to interconnect the contact substrate 20 to an external structure such as a probe card or IC package through a wire or lead.

Thus, when the semiconductor wafer 300 moves upward, the contactors 30 and the contact targets 320 on the semiconductor wafer 300 mechanically and electrically contact with each other. Consequently, a signal path is established from the contact target 320 to the electrode 22 on the substrate 20. The interconnect trace 24, the via hole 23 and the electrode 22 also function to fan-out the small pitch of the contactors 30 to a larger pitch to fit to the probe card or IC package.

Figure 15:
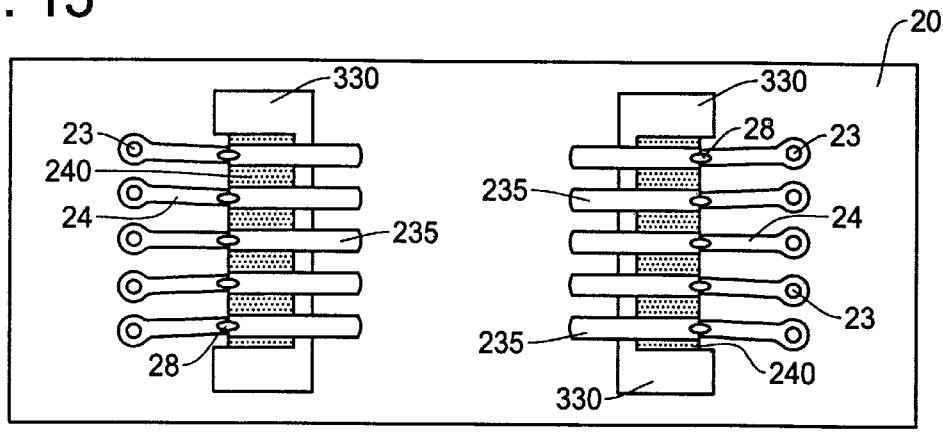
FIG. 15 is a schematic diagram showing a bottom view of the contact structure FIG. 14 having the contactors of the present invention mounted on the contact substrate.

FIG. 15 is a schematic diagram showing a bottom view of the contact structure of FIG. 14 having the contactors mounted on the planar surface thereof. In this example, the adhesives 330 are used to bond the contactors 30 to the surface of the contact substrate at the sides of the set of the contactors 30 as well as at the corners formed by the silicon base 240 and the contact. substrate 20 as shown in FIG. 14.

Figure 16A:
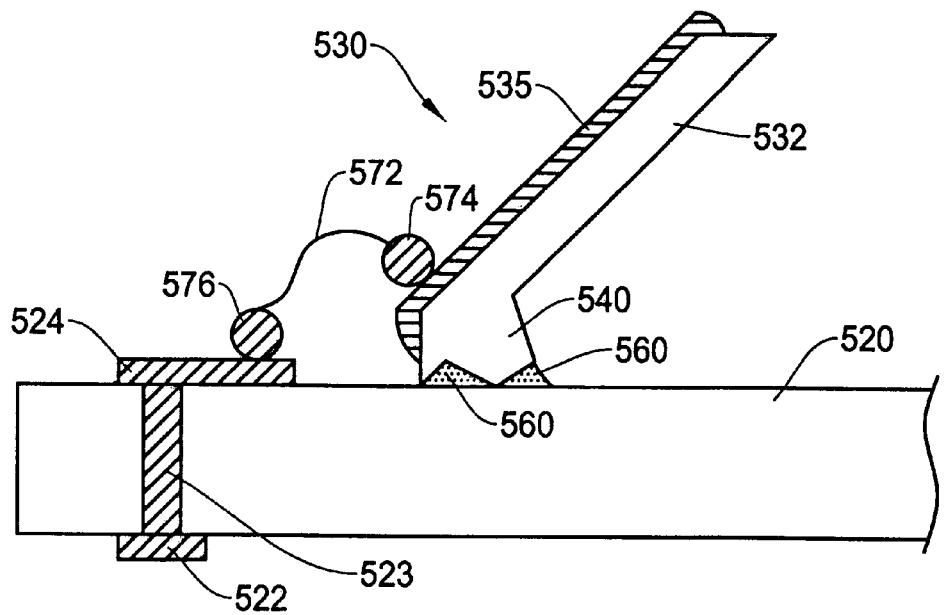
FIGS. 16A and 16B are schematic cross sectional views showing further examples of contact structure of the present invention and a method for assembling the contactors of the present invention on the contact substrate.
Figure 16B:
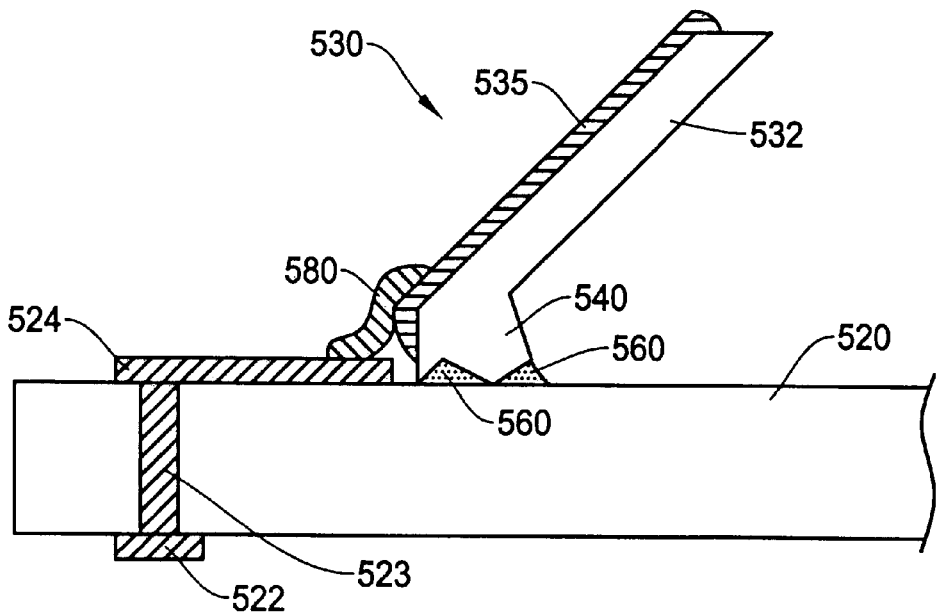

FIGS. 16A and 16B are schematic cross sectional views showing further examples of contact structure of the present invention and a method for assembling the contactors of the present invention on the contact substrate. In FIGS. 16A and 16B, a contactor 530 is configured by a silicon beam 532, a silicon base 540 and a conductive layer 535. The contactor 530 is mounted on a contact substrate 520 by attaching the silicon base 540 to the surface of the contact substrate through an adhesive 560. The contact substrate 520 has electrodes 522, 524 and via hole 523.

The difference in the contact structures between FIG. 16A and FIG. 16B resides in the manner of connecting the conductive layer 535 of the contactor 530 with the electrode 524 on the contact substrate 520. In FIG. 16A, a bonding wire 572 connects the electrode 524 and the conductive layer 535. In FIG. 16B, a solder ball 580 connects the electrode 524 and the conductive layer 535. Generally, the connection by the solder ball 580 requires that the electrode 524 and the conductive 535 are close enough to reflow the solder, i.e., higher precision in production and assembly processes. Further, the adhesives remained in the solder area may interfere sufficient connection by the solder ball 580. Thus, in an actual implementation, the connection by the wire bonding as shown in FIG. 16A will be preferable.

The contactor 530 in the example of FIGS. 16A and 16B has, at both proximal and distal ends of the silicon beam 532, inclined edges made through the anisotropic etch process. In the manner similar to the silicon base 240 in FIGS. 13 and 14, the silicon base 540 is also inclined at both sides, which are made through the anisotropic etch process. In the example of FIGS. 16A and 16B, the proximal end of the silicon beam 532 and the silicon base 540 are attached to the surface of the contact substrate. The spaces created between the contactor 530 and the surface of the contact substrate 520 are utilized for applying the adhesive 560, thereby securely attaching the contactor 530 to the contact substrate 520.

Figure 17:
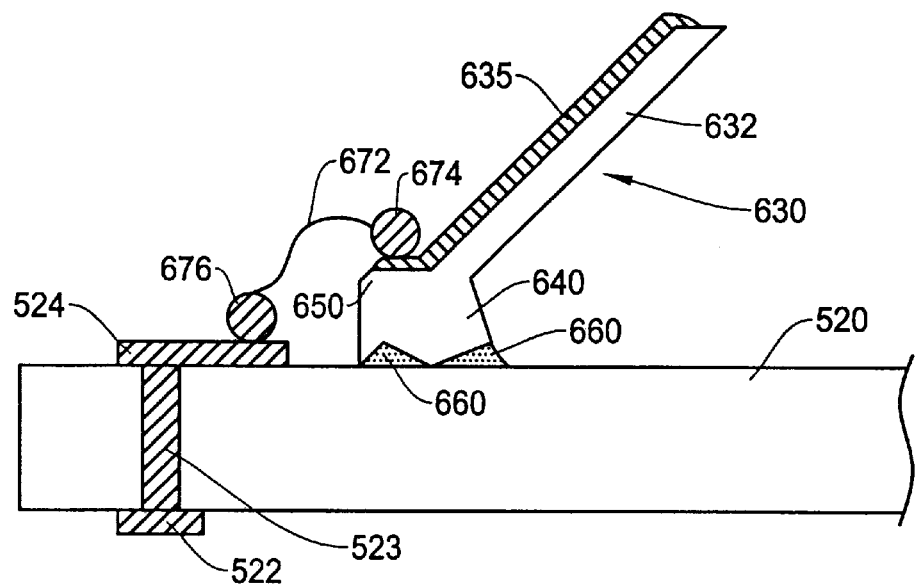
FIG. 17 is a schematic cross sectional view showing a further example of contact structure of the present invention and a method for assembling the contactors of the present invention on the contact substrate.

FIG. 17 shows a cross sectional view of a further example of contact structure of the present invention. A contactor 630 in FIG. 17 has a silicon beam 632 which is provided with a step 650 close to the proximal end thereof. The step 650 is also created through the anisotropic etch process as will be described later. A conductive layer 635 is extended on the step 650 so that the conductive layer 635 also forms a step shape. When the contactor 630 is mounted on the contact substrate 620, the conductive layer 635 on the step 650 creates a horizontal surface convenient for wire bonding.

The proximal end of the silicon beam 632 and the silicon base 640 are attached to the surface of the contact substrate 520 with use of an adhesive 660. The adhesive 660 is applied to the spaces created by the contactor 630 and the contact substrate because of the inclined indentations of the contactor 630. When mounted on the contact substrate 520, the contactor 630 is oriented in a predetermined direction determined by the dimension of the silicon base 640 and the proximal end of the silicon beam 632. A bonding wire 672 connects the electrode 524 on the contact substrate 520 and the conductive layer 635 of the contactor 630.

Figure 18:
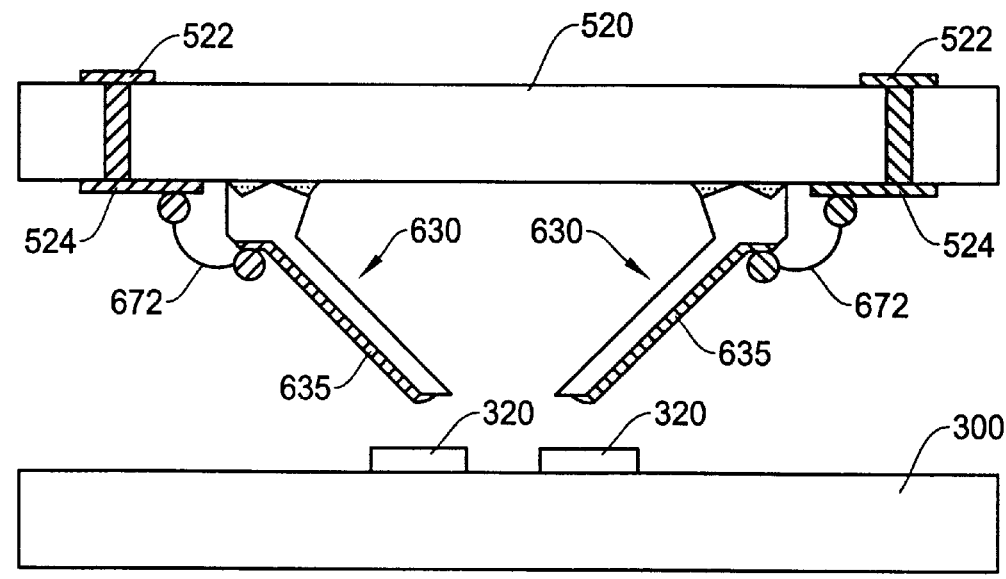
FIG. 18 is a schematic cross sectional diagram showing an example of the contact structure using the assembly method of FIG. 17 of the present invention positioned on the semiconductor wafer.

FIG. 18 shows a cross sectional view of the contact structure using the contactor 630 and assembly method of FIG. 17 of the present invention. The contactors 630 are mounted on the contact substrate 520 by attaching the silicon base 640 base and the proximal end of the silicon beam 632 to the surface of the contact substrate 520. The bonding wire 672 connects the electrode 524 on the contact substrate 520 and the step formed on the conductive layer 635 of the contactor 630. The contact structure is positioned over the semiconductor wafer 300 having the contact pads 320. When the contact structure and the semiconductor wafer 300 are pressed to one another, electrical communication will be established between the contactors 630 and the contact pads 320, thereby enabling, for example, to test the semiconductor wafer 300 by semiconductor test system.

FIGS. 19A–19F show an example of process for producing the contactors 530 of the present invention shown in FIGS. 16A and 16B. In a top view of FIG. 19A, through a photolithography process, for example, mask patterns 552 are formed on the top surface of a silicon substrate 540 which is cut in a (100) crystal plane. The mask pattern 552 is made of, for example, silicon dioxide ($SiO_2$). The silicon dioxide layer (mask pattern) 552 is to function as an etch mask when anisotropic etch is performed as well as an insulator between the conductive layer 535 and the silicon beam 532. For an illustration purpose, this example shows only four patterns for producing four contactors, although a large number of contactors will be produced at the same time in an actual implementation.

Figure 19A:
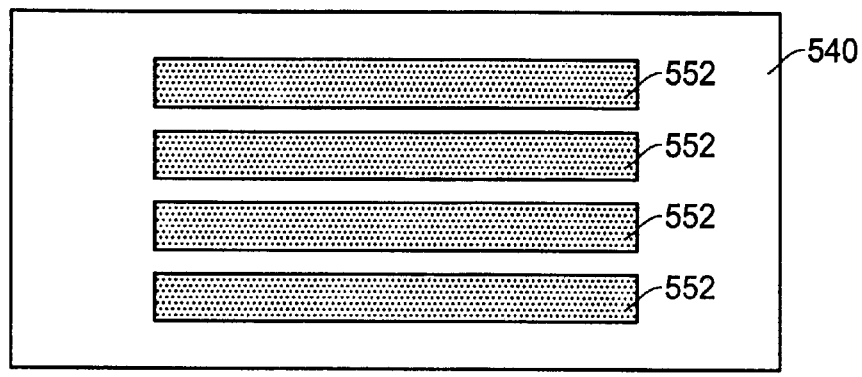
FIGS. 19A–19F are schematic diagrams showing an example of process for producing the contactors of the present invention shown in FIGS. 16A and 16B.
Figure 19B:
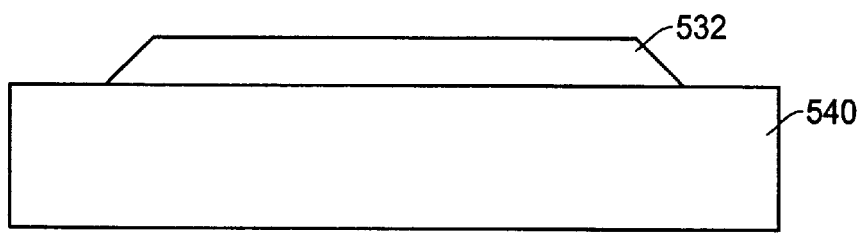

By applying an anisotropic etching process to the top surface of the silicon substrate 540 while controlling the etching progress by, for example, a time length of the etching, the silicon beams 532 are created on the silicon substrate as shown in a cross section view of FIG. 19B. Because the silicon substrate 540 is cut in a (100) crystal plane, through the anisotropic etching, a diagonal edge is created at each end of the silicon beam 532. The angle of the diagonal edge is 54.7° relative to the surface of the silicon substrate 40. The edge angle is the same as a (111) crystal plane of the silicon substrate 40.

Figure 19C:
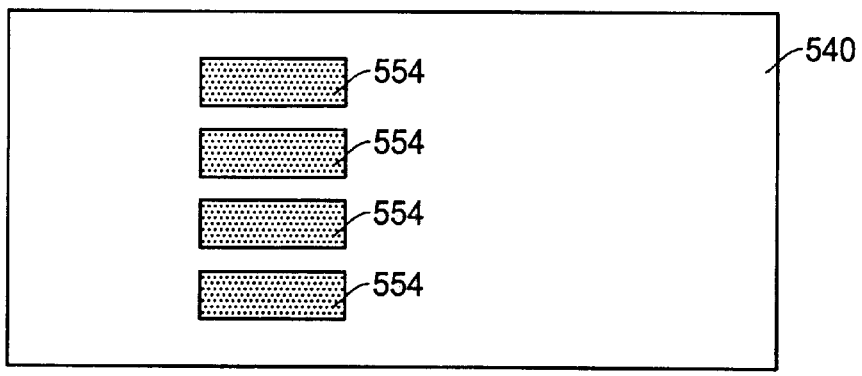
Figure 19D:
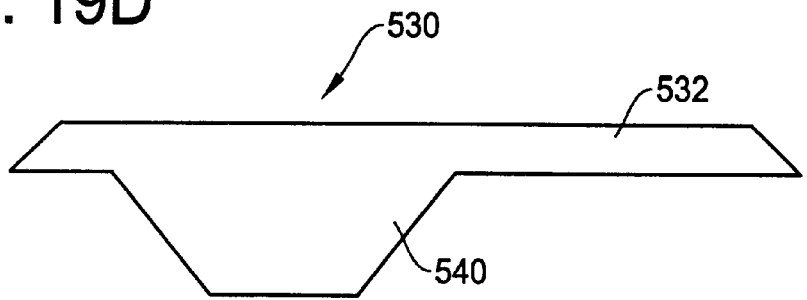

Similarly, on a bottom surface of the silicon substrate 540, mask patterns 554 are formed as shown in FIG. 19C. The mask pattern 554 functions as an etch mask during the anisotropic etch for forming the silicon base 540. Thus, by applying the anisotropic etching process to the bottom surface of the silicon substrate 540 while controlling its progress by the time length, the silicon bases 540 are created at the silicon substrate as shown in a cross sectional view of FIG. 19D. The silicon base 540 has diagonal edges at both sides, the angle of which is 54.7° relative to the surface of the silicon substrate 540. The cross sectional view of the contactor 530 has the silicon base 540 and the silicon beam 532.

Figure 19E:
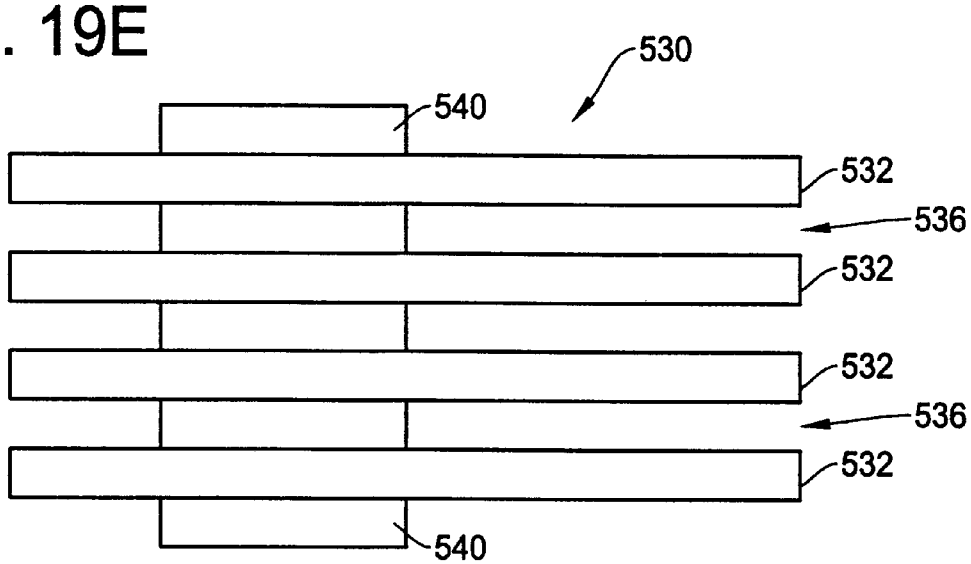
Figure 19F:
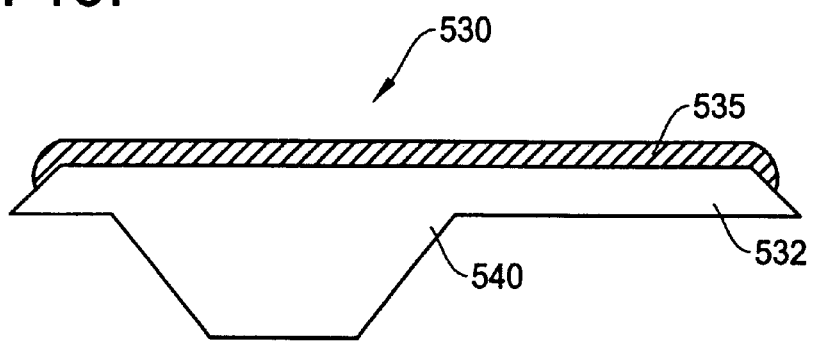

FIG. 19E is a top view of the contactors 530 of the present invention. Because of the anisotropic etching, the silicon substrate other than the silicon beams 532 and the silicon bases 540 is etched away, thereby establishing a free space 536 between two adjacent silicon beams 532. In a cross sectional view of FIG. 19F, conductive material is deposited, such as by plating, on the top surface of the silicon beam 532. Thus, the conductive layer 535 is created between both ends of the silicon beam 532, completing the contactor 530. Although not shown, as noted above, the insulation layer, such as silicon dioxide ($SiO_2$) is provided between the silicon beam 532 and the conductive layer 535 to electrically insulate therebetween.

Figure 20A:
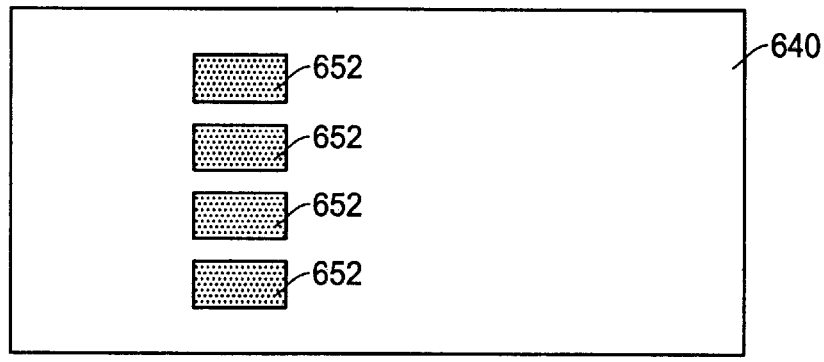
FIGS. 20A–20H are schematic diagrams showing an example of process for producing the contactors of the present invention shown in FIGS. 17 and 18.

FIGS. 20A–20H show an example of process for producing the contactors 630 of the present invention shown in FIGS. 17 and 18. In FIG. 20A, which is a top view of the silicon substrate 640, mask patterns 652 are formed on the top surface of the silicon substrate 640 which is cut in a (100) crystal plane. Typically, the mask pattern 652 is made of a silicon dioxide ($SiO_2$) layer. As noted above, the mask pattern 652 works as an etch mask when anisotropic etch is performed as well as an insulator between the conductive layer 635 and the silicon beam 632 of the contactor 630. Although a large number of contactors will be produced at the same time in an actual implementation, this example shows only four patterns for producing four contactors 630 for illustration purpose only.

Figure 20B:
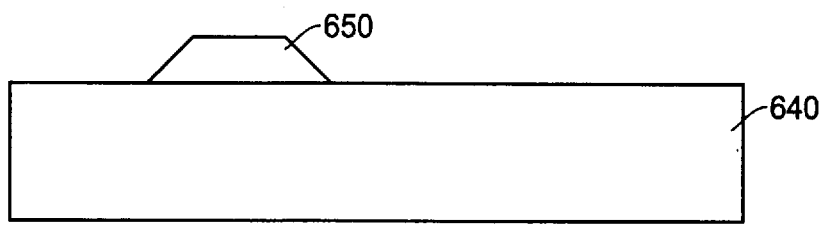

By applying an anisotropic etching process to the top surface of the silicon substrate 640 while controlling the etching progress by, for example, a time length of the etching, the steps 650 are created on the silicon substrate 640 as shown in a cross section view of FIG. 20B. Because the silicon substrate 640 is cut in the (100) crystal plane, through the anisotropic etching, each step 650 has a flat surface and inclined edges at both ends.

Figure 20C:
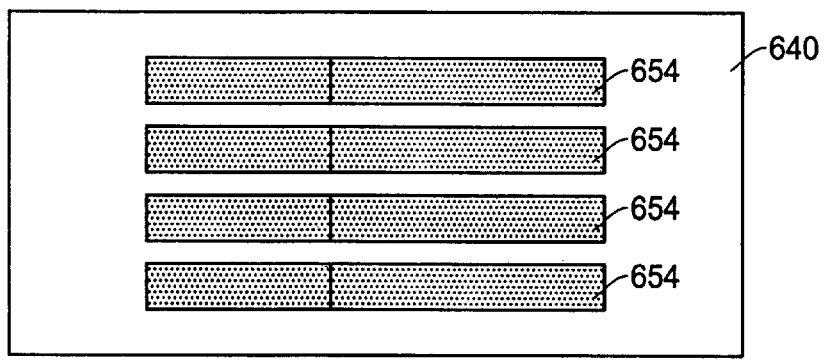
Figure 20D:
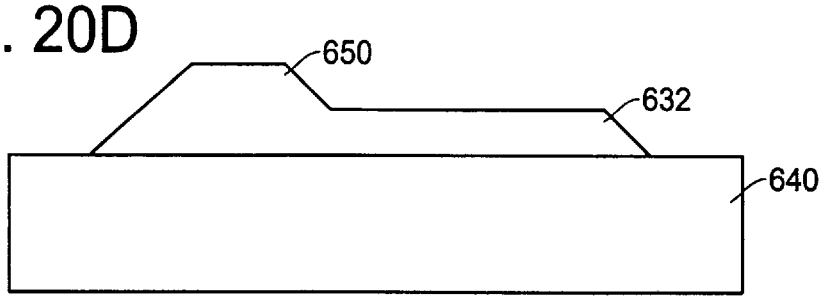

In the process of FIG. 20C, mask patterns 654 are formed on the top surface of the silicon substrate 640. Each of the mask patterns 654 covers the corresponding step 650 as well as further extends along the horizontal surface of the silicon substrate 640. In FIG. 20D, by applying an anisotropic etching process to the top surface of the silicon substrate 640 while controlling the etching time, the silicon beams 632 are created on the silicon substrate 640. Each silicon beam has the step 650 thereon which functions as a bonding step as shown in FIGS. 17 and 18. Through the anisotropic etching, a diagonal edge is created at each end of the silicon beam 632.

Figure 20E:
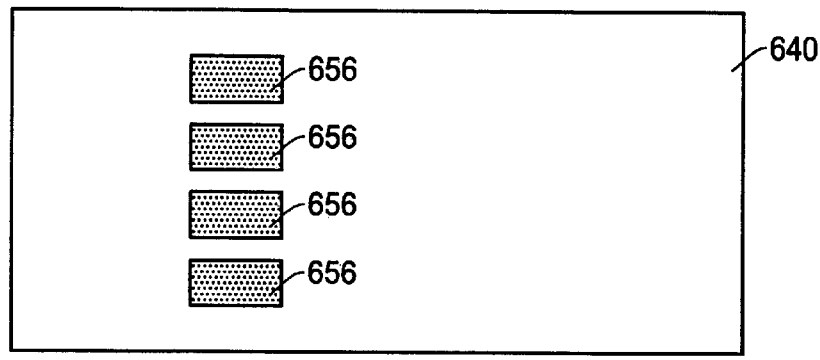
Figure 20F:
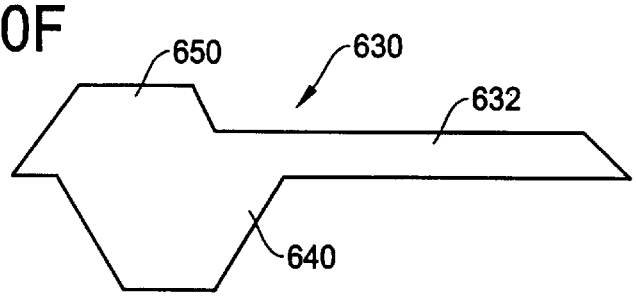

Similarly, on a bottom surface of the silicon substrate 640, mask patterns 656 are formed as shown in FIG. 20E. Each mask pattern 656 functions as an etch mask during the anisotropic etch for forming the silicon base 640. Thus, by applying the anisotropic etching process to the bottom surface of the silicon substrate 640 while controlling its progress by the time length, the silicon bases 640 are created at the silicon substrate 640 as shown in a cross sectional view of FIG. 20F. The silicon base 640 has diagonal edges at both sides, the angle of which is 54.7° relative to the surface of the silicon substrate 640. The cross sectional view of the contactor 630 shows the silicon base 640 and the silicon beam 632 and the step 650 on the silicon beam 632.

Figure 20G:
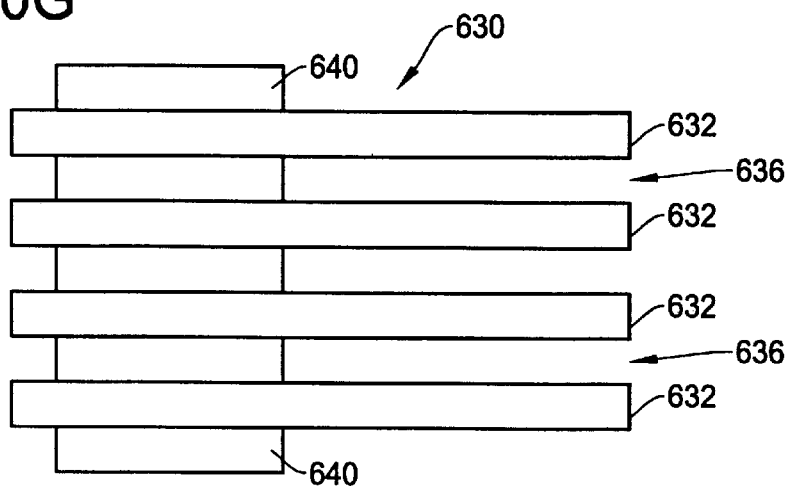
Figure 20H:
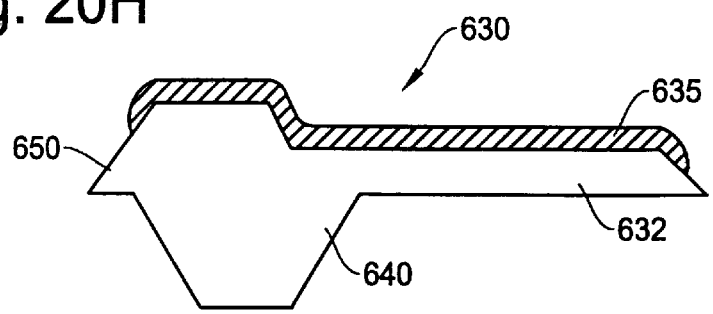

FIG. 20G is a top view of the contactors 630 of the present invention. Because of the anisotropic etching, the silicon substrate other than the silicon beams 632, steps 650 and the silicon bases 640 is etched away, thereby establishing a free space 636 between two adjacent silicon beams 632. In a cross sectional view of FIG. 20H, conductive material is deposited, such as by plating, on the top surface of the silicon beam 632. Thus, the conductive layer 635 is created between both ends of the silicon beam 632, completing the contactor 630. Although not shown, as noted above, the insulation layer, such as silicon dioxide ($SiO_2$) is provided between the silicon beam 632 and the conductive layer 635 to electrically insulate therebetween.

According to the present invention, the contact structure has a very high frequency bandwidth to meet the requirements of next generation semiconductor technology. Since the probe contactor is formed through a modern miniaturization technology used in the semiconductor production process, a large number of contactors can be aligned in a small space which is suitable for testing a large number of semiconductor devices at the same time.

Since the large number of contact structures are produced at the same time on the substrate with the use of the microfabrication technology without involving manual handling, it is possible to achieve consistent quality, high reliability and long life in the contact performance. Further, because the contact structures can be fabricated on the same substrate material as that of the device under test, it is possible to compensate the temperature expansion coefficient of the device under test, which is able to avoid positional errors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing electrical connect with contact target, comprising:
   a plurality of contactors, each of said contactors being comprised of:
   a silicon base having an inclined edge at each end whose angle is dependent upon a crystal plane of a silicon substrate;
   a silicon beam formed on said silicon base and has a support end and a contact end, each of said support end and said contact end having a diagonal edge whose angle is dependent upon the crystal plane, said support end being slightly projected from the silicon base and said contact end being substantially projected from the silicon base; and
   a conductive layer formed on a top surface of the silicon beam;
   a contact substrate for mounting said plurality of contactors on a surface thereof;
   wherein each of said contactors is mounted on the contact substrate in a manner that said silicon base and said support end of said silicon beam are connected to the surface of said contact substrate through an adhesive, thereby orienting said silicon beam in a predetermined diagonal direction.

2. A contact structure as defined in claim 1, wherein said contact substrate is made of silicon.

3. A contact structure as defined in claim 1, wherein said contact substrate is made of ceramic.

4. A contact structure as defined in claim 1, further comprising a plurality of contact traces provided on the surface of said contact substrate and respectively connected to conductive layers of said contactors at one ends.

5. A contact structure as defined in claim 4, wherein said contact trace on said contact substrate and said conductive layer of said contactor are connected through a bonding wire.

6. A contact structure as defined in claim 4, wherein said contact trace on said contact substrate and said conductive layer of said contactor are connected through a solder ball.

7. A contact structure as defined in claim 4, further comprising:
   a plurality of via holes running between top and bottom surfaces of said contact substrate and connected to other ends of said contact traces; and
   a plurality of electrodes connected to said plurality of via holes for electrical connections external components.

8. A contact structure for establishing electrical connect with contact target, comprising:
   a plurality of contactors, each of said contactors being comprised of:
   a silicon base having an inclined edge at each end whose angle is dependent upon a crystal plane of a silicon substrate;
   a silicon beam formed on said silicon base and has a support end and a contact end, each of said support end and said contact end having a diagonal edge whose angle is dependent upon the crystal plane, said support end being slightly projected from the silicon base and said contact end being substantially projected from the silicon base;
   a conductive layer formed on a top surface of the silicon beam, said conductive layer having a step formed of an edge inclined along the predetermined crystal plane;

a contact substrate for mounting said plurality of contactors on a surface thereof;

wherein each of said contactors is mounted on the contact substrate in a manner that said silicon base and said support end of said silicon beam are connected to the surface of said contact substrate through an adhesive, thereby orienting said silicon beam in a predetermined diagonal direction.

9. A contact structure as defined in claim 8, wherein said contact substrate is made of silicon.

10. A contact structure as defined in claim 8, wherein said contact substrate is made of ceramic.

11. A contact structure as defined in claim 8, further comprising a plurality of contact traces provided on the surface of said contact substrate and respectively connected to conductive layers of said contactors at one ends.

12. A contact structure as defined in claim 11, wherein said contact trace on said contact substrate and said conductive layer of said contactor are connected through a bonding wire where one end of said bonding wire is bonded to said step on said conductive layer.

13. A contact structure as defined in claim 11, further comprising:

a plurality of via holes running between top and bottom surfaces of said contact substrate and connected to other ends of said contact traces; and a plurality of electrodes connected to said plurality of via holes for electrical connections external components.

14. A method of producing a contact structure for electrical communication with a contact target, comprising the following steps of:

providing a silicon substrate cut in a (100) crystal plane;

forming a first etch mask pattern on a top surface of said silicon substrate;

applying a first etching process to said top surface of said silicon substrate thereby forming a silicon beam of a contactor;

forming a second mask pattern on a bottom surface of said silicon substrate;

applying a second etching process to said top surface of said silicon substrate thereby forming a silicon base of said contactor;

depositing conductive material on a top surface of said silicon beam thereby creating a conductive layer; and mounting a plurality of contactors produced in the foregoing steps on a contact substrate in predetermined diagonal directions.

15. A method of producing a contact structure as defined in claim 14, wherein after said first etching process, said silicon base has an inclined edge at each end thereof whose angle is dependent upon a crystal plane of said silicon substrate when said first etching process incorporates anisotropic etch.

16. A method of producing a contact structure as defined in claim 14, wherein after said second etching process, said silicon beam has a support end and contact end, each of said support end and said contact end having a diagonal edge whose angle is dependent upon a crystal plane of said silicon substrate when said second etching process incorporates anisotropic etch.

17. A method of producing a contact structure as defined in claim 16, wherein said step of mounting said contactor on said contact substrate includes a step of connecting said silicon base and said support end of said silicon beam to a surface of said contact substrate through an adhesive thereby orienting said silicon beam in said predetermined diagonal direction.

18. A method of producing a contact structure as defined in claim 14, prior to said step of forming said first mask pattern, further comprising the steps of:

forming an etch mask pattern on said top surface of said silicon substrate; and applying an etching process to said top surface of said silicon substrate thereby forming a step of said conductive layer on said silicon beam.

19. A method of producing a contact structure as defined in claim 18, wherein said step of mounting said contactor on said contact substrate includes a step of connecting said silicon base and said support end of said silicon beam to a surface of said contact substrate through an adhesive thereby orienting said silicon beam in said predetermined diagonal direction, and a step of connecting a contact trace provided on said contact substrate with said contactor.

20. A method of producing a contact structure as defined in claim 19, wherein said step of connecting said contact trace with said contactor includes a step of bonding a wire between said contact trace and said step of said conductive layer.

* * * * *